United States Patent
Chae et al.

(10) Patent No.: US 12,004,382 B2
(45) Date of Patent: Jun. 4, 2024

(54) DISPLAY PANEL AND ELECTRONIC APPARATUS

(71) Applicant: Samsung Display Co., Ltd., Yongin-si (KR)

(72) Inventors: Jongwon Chae, Yongin-si (KR); Moosoon Ko, Yongin-si (KR); Sewan Son, Yongin-si (KR); Kyunghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 222 days.

(21) Appl. No.: 17/158,972

(22) Filed: Jan. 26, 2021

(65) Prior Publication Data

US 2021/0376033 A1    Dec. 2, 2021

(30) Foreign Application Priority Data

Jun. 1, 2020   (KR) .................. 10-2020-0066023

(51) Int. Cl.
| | |
|---|---|
| *H10K 59/126* | (2023.01) |
| *H01L 27/15* | (2006.01) |
| *H10K 59/121* | (2023.01) |
| *H10K 59/123* | (2023.01) |
| *H10K 59/124* | (2023.01) |
| *H10K 59/131* | (2023.01) |
| *H10K 59/35* | (2023.01) |
| *H10K 59/40* | (2023.01) |

(52) U.S. Cl.
CPC ......... *H10K 59/126* (2023.02); *H10K 59/131* (2023.02); *H10K 59/353* (2023.02)

(58) Field of Classification Search
CPC .. H10K 59/126; H10K 59/131; H10K 59/353; H10K 59/38; H10K 59/40; H10K 59/65
See application file for complete search history.

(56) References Cited

U.S. PATENT DOCUMENTS

| | | | |
|---|---|---|---|
| 6,703,146 B1 | 3/2004 | Sakaguchi et al. | |
| 9,257,563 B2 | 2/2016 | Ahn et al. | |
| 9,647,045 B2 | 5/2017 | Jung et al. | |
| 9,660,010 B2 | 5/2017 | Park et al. | |
| 11,489,032 B2 | 11/2022 | Hsieh | |
| 2016/0293687 A1* | 10/2016 | Chang | H10K 59/126 |

(Continued)

FOREIGN PATENT DOCUMENTS

| | | |
|---|---|---|
| CN | 204651324 U | 9/2015 |
| CN | 112119444 B | 10/2022 |

(Continued)

OTHER PUBLICATIONS

Extended European Search Report issued in corresponding EP Application No. 21175186.2 dated Oct. 28, 2021, 9 pages.

*Primary Examiner* — Mohsen Ahmadi
(74) *Attorney, Agent, or Firm* — Lewis Roca Rothgerber Christie LLP

(57) ABSTRACT

A display panel includes a substrate, two pixels arranged on the substrate and spaced from each other with a transmission area therebetween, and a blocking layer between the substrate and the two pixels, the blocking layer including an opening corresponding to the transmission area. An edge of the opening includes a plurality of convex portions.

10 Claims, 29 Drawing Sheets

(56) References Cited

U.S. PATENT DOCUMENTS

| | | | |
|---|---|---|---|
| 2017/0053971 A1* | 2/2017 | Sato | H10K 50/813 |
| 2017/0250240 A1* | 8/2017 | Lee | H10K 59/131 |
| 2020/0105844 A1* | 4/2020 | Wang | H10K 59/126 |
| 2020/0110495 A1* | 4/2020 | Han | G06F 3/0443 |
| 2020/0161582 A1* | 5/2020 | Choi | G06F 3/042 |
| 2020/0313101 A1* | 10/2020 | Jung | H10K 59/12 |
| 2020/0365664 A1* | 11/2020 | Jeon | H10K 59/121 |
| 2020/0403040 A1* | 12/2020 | Park | H10K 50/171 |
| 2021/0013452 A1* | 1/2021 | Kim | G06F 3/0446 |
| 2021/0126077 A1* | 4/2021 | Chae | H10K 59/131 |
| 2021/0143231 A1* | 5/2021 | Chae | H10K 59/353 |
| 2021/0175303 A1* | 6/2021 | Bang | H10K 59/122 |
| 2021/0210564 A1* | 7/2021 | Chae | H10K 59/352 |
| 2021/0241671 A1* | 8/2021 | Lee | G09G 3/3225 |
| 2021/0265396 A1* | 8/2021 | Kim | H10K 59/65 |
| 2021/0305343 A1* | 9/2021 | Oh | H10K 71/00 |

FOREIGN PATENT DOCUMENTS

| | | |
|---|---|---|
| KR | 10-0389568 B1 | 6/2003 |
| KR | 10-1406129 B1 | 6/2014 |
| KR | 10-2016-0015433 A | 2/2016 |
| KR | 10-2016-0053001 A | 5/2016 |
| KR | 10-2019-0053732 A | 5/2019 |
| WO | WO 2020/199147 A1 | 10/2020 |

\* cited by examiner

DISPLAY PANEL AND ELECTRONIC APPARATUS

CROSS-REFERENCE TO RELATED APPLICATION

This application claims priority to and the benefit of Korean Patent Application No. 10-2020-0066023, filed on Jun. 1, 2020, in the Korean Intellectual Property Office (KIPO), the entire disclosure of which is incorporated by reference herein.

BACKGROUND

1. Field

One or more embodiments relate to a display panel and an electronic apparatus including the same.

2. Description of Related Art

Recently, display apparatuses have been used in an increasingly diverse range of applications. As display apparatuses become slimmer and lighter, the range of uses for display apparatuses has widened.

As the areas occupied by display areas in display apparatuses have increased, various functions connected to or linked to display apparatuses have also been added. Therefore, research has been conducted into display apparatuses having a region for adding various functions, other than a function of displaying an image, to the display areas to provide a method of adding various functions while increasing the areas of the display areas.

SUMMARY

Aspects of one or more embodiments are directed towards a display panel having an extended display area such that an image may be displayed even in an area where an electronic component is arranged, and an electronic apparatus including the same. However, the one or more embodiments are only examples, and the scope of the disclosure is not limited thereby.

Additional aspects will be set forth in part in the description which follows and, in part, will be apparent from the description, or may be learned by practice of the presented embodiments of the disclosure.

According to one or more embodiments, a display panel includes a substrate, two pixels on the substrate and spaced from each other with a transmission area therebetween, and a blocking layer between the substrate and the two pixels, the blocking layer including an opening corresponding to the transmission area, wherein an edge of the opening includes a plurality of convex portions.

A width of each of the plurality of convex portions may be less than or equal to about 10% of a width of the opening.

The width of each of the plurality of convex portions may be about 5% to about 10% of the width of the opening.

Each of the plurality of convex portions may be semicircular, semi-elliptical, triangular, or quadrangular.

Each of the two pixels may include a light-emitting diode, and each of the light-emitting diodes may be electrically connected to a pixel circuit including a transistor and a capacitor.

The blocking layer may be between the substrate and the pixel circuit.

The opening of the blocking layer may be symmetrical with respect to a virtual first axis passing through a center of the opening and extending in a first direction.

The opening of the blocking layer may be symmetrical with respect to a virtual second axis passing through the center of the opening and extending in a second direction intersecting the first direction.

The opening of the blocking layer may include a first portion and a second portion arranged along the first direction and located at respective sides of the opening with the center of the opening therebetween, and a third portion and a fourth portion arranged along a second direction intersecting the first direction and located at respective sides of the opening with the center of the opening therebetween.

An edge of the first portion, an edge of the second portion, an edge of the third portion, and an edge of the fourth portion may each include different ones of the plurality of convex portions.

According to one or more embodiments, an electronic apparatus includes a display panel, and a component overlapping the display panel, wherein the display panel includes a substrate, two pixel circuits on the substrate and spaced from each other with a transmission area therebetween, two light-emitting diodes connected to the two pixel circuits, respectively, and a blocking layer between the substrate and the two pixel circuits, the blocking layer including a plurality of openings corresponding to the component, and an edge of a first opening from among the plurality of openings of the blocking layer includes a plurality of convex portions.

A width of each of the plurality of convex portions may be less than or equal to about 10% of a width of the first opening.

The width of each of the plurality of convex portions may be about 5% to about 10% of the width of the first opening.

A width of each of the plurality of convex portions may be about 10 μm to about 20 μm.

Each of the plurality of convex portions may be semicircular, semi-elliptical, triangular, or quadrangular.

The first opening of the blocking layer may be symmetrical with respect to at least one of a virtual first axis and a virtual second axis, wherein the virtual first axis passes through a center of the first opening and extends in a first direction, and the virtual second axis passes through the center of the first opening and extends in a second direction intersecting the first direction.

The first opening of the blocking layer may include a first portion and a second portion arranged along the first direction and located at opposite sides of the first opening with the center of the first opening therebetween, and a third portion and a fourth portion arranged along the second direction and located at opposite sides of the first opening with the center of the first opening therebetween.

An edge of the first portion, an edge of the second portion, an edge of the third portion, and an edge of the fourth portion may each include different ones of the plurality of convex portions.

The plurality of openings of the blocking layer may be arranged in rows and columns or in a zigzag pattern.

The component may include a sensor or a camera.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
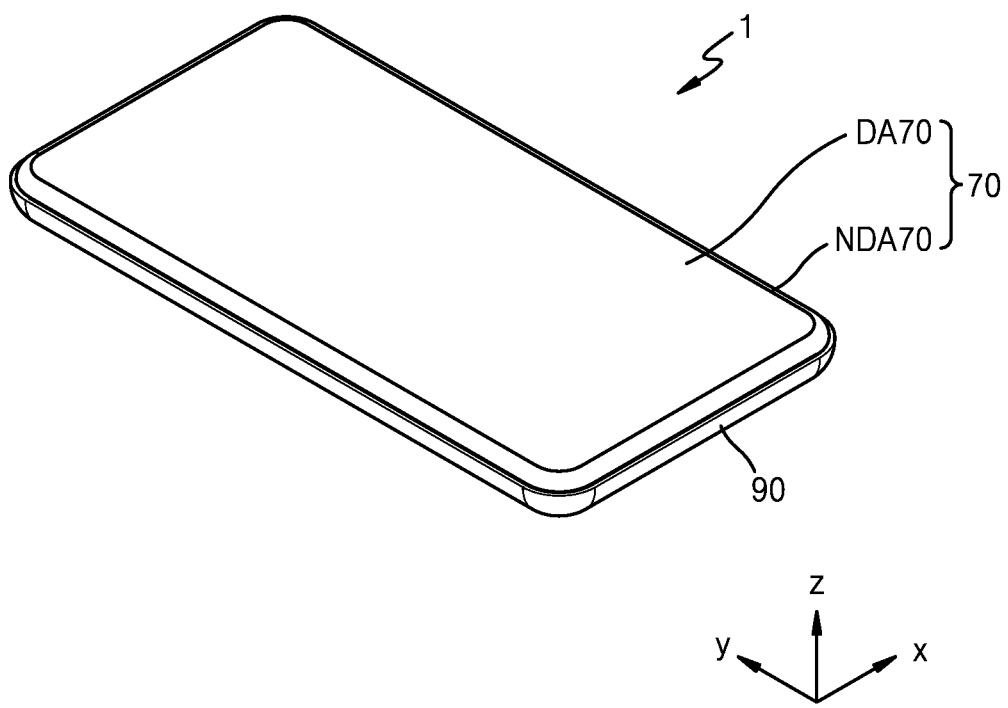
FIG. 1 is a perspective view of an electronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

The disclosure may have various modifications and embodiments. Specific embodiments are illustrated in the drawings and will be described in detail in the detailed description. The effects and features of the disclosure and methods of achieving them will become more apparent from the following embodiments that are described in detail in conjunction with the accompanying drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals. A redundant description thereof will be omitted.

It will be understood that although the terms "first," "second," etc. may be used herein to describe various elements, these elements should not be limited by these terms. These terms are only used to distinguish one element from another.

Further, the use of "may" when describing embodiments of the present disclosure refers to "one or more embodiments of the present disclosure".

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. In other words, because the sizes and thicknesses of elements in the drawings are arbitrarily illustrated for convenience of description, the disclosure is not limited thereto.

When a certain embodiment may be implemented differently, a specific process order may be performed differently from the described order. For example, two consecutively described processes may be performed substantially at the same time or performed in an order opposite to the described order.

In the following embodiments, it will be understood that when a layer, region, or element is referred to as being "connected to" or "coupled to" another layer, region, or element, it may be directly or indirectly connected or coupled to the other layer, region, or element. That is, for example, intervening layers, regions, or elements may be present. In the following embodiments, it will be understood that when a layer, region, or element is referred to as being "electrically connected to" or "electrically coupled to" another layer, region, and element, it may be directly or indirectly electrically connected or coupled to the other layer, region, or element. That is, for example, intervening layers, regions, or elements may be present.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
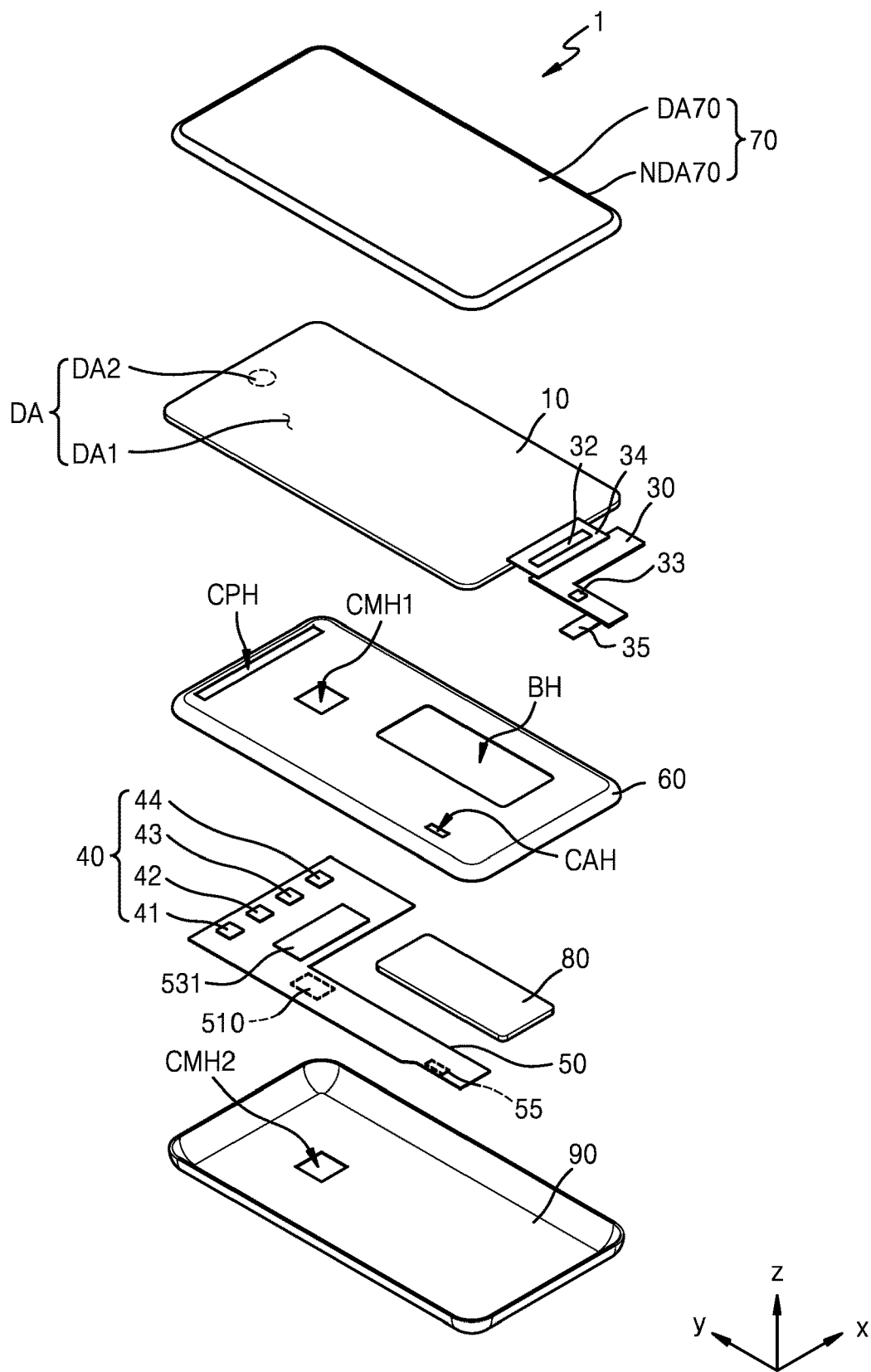
FIG. 2 is an exploded perspective view of an electronic apparatus according to an embodiment.
Figure 3:
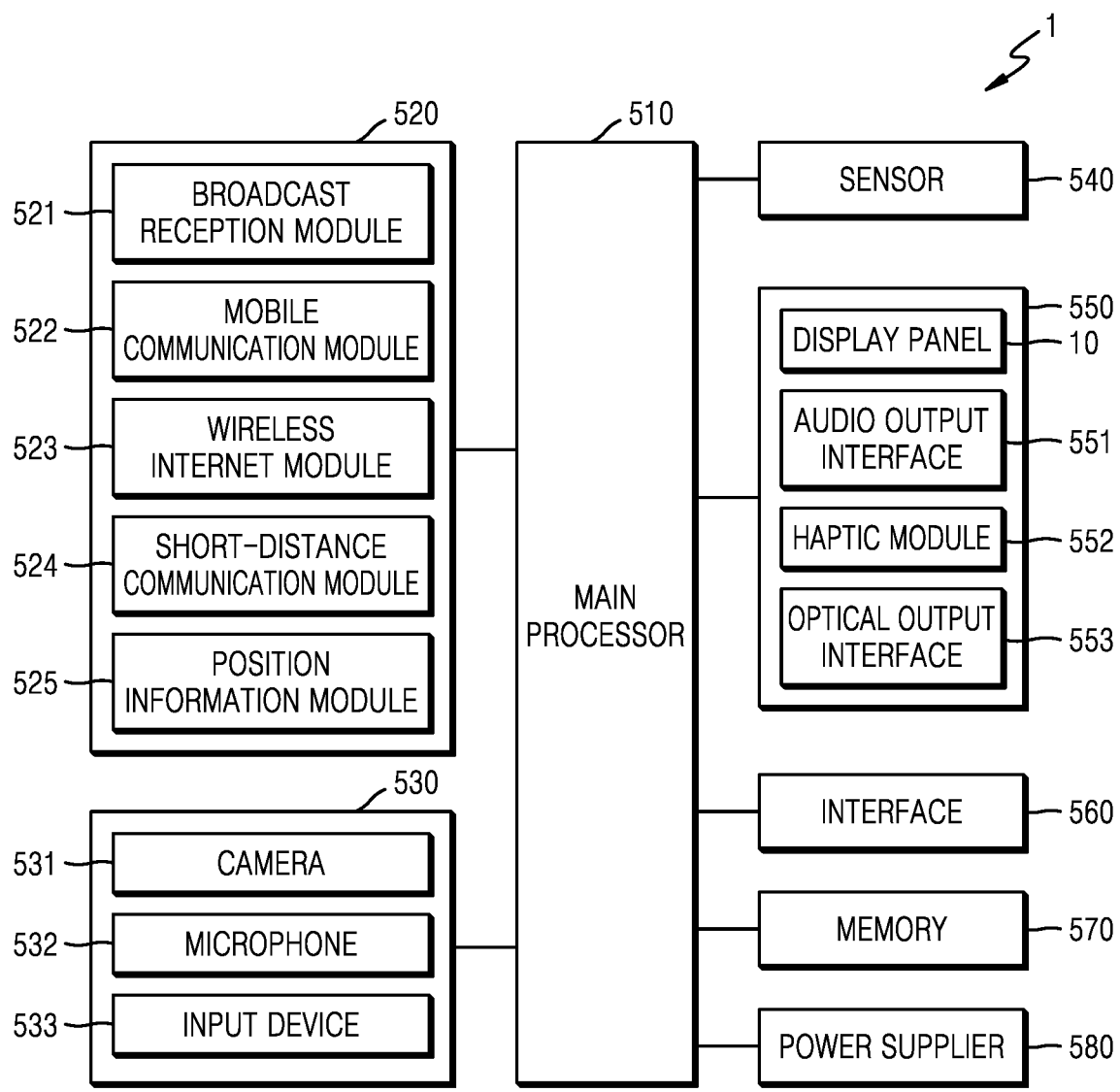
FIG. 3 is a block diagram of an electronic apparatus according to an embodiment.

FIG. 1 is a perspective view of an electronic apparatus 1 according to an embodiment. FIG. 2 is an exploded perspective view of the electronic apparatus 1 according to an embodiment. FIG. 3 is a block diagram of the electronic apparatus 1 according to an embodiment.

Referring to FIGS. 1 and 2, the electronic apparatus 1 according to an embodiment displays a moving picture or a still image, and thus may be used as the display screen of various products such as a portable electronic apparatus (e.g., a mobile phone, a smartphone, a tablet personal computer, a mobile communication terminal, an electronic notebook, an electronic book, a portable multimedia player (PMP), a navigation device, and an ultra mobile PC (UMPC)), a television, a notebook, a monitor, an advertisement panel, and an internet of things (IoT) device. The electronic apparatus 1 according to an embodiment may also be used in a wearable device such as a smart watch, a watch phone, a glasses-type display, and a head mounted display (HMD). The electronic apparatus 1 according to an embodiment may also be used as a dashboard of an automobile, a center information display (CID) of a center fascia or a dashboard of automobiles, a room mirror display that replaces the side mirrors of automobiles, and a display arranged on the rear sides of front seats to serve as an entertainment device for back seat passengers of automobiles.

For convenience of explanation, FIGS. 1 and 2 illustrate use of a smartphone as the electronic apparatus 1 according to an embodiment. However, the present disclosure is not limited thereto. As illustrated in FIGS. 1 and 2, the electronic apparatus 1 according to an embodiment includes a cover window 70, a display panel 10, a display circuit board 30, a display driver 32, a touch sensor driver 33, a bracket 60, a main circuit board 50, a battery 80, and a lower cover 90.

In a plan view, the terms "left," "right," "upper," and "lower" indicate directions when the display panel 10 is viewed in a direction perpendicular to the display panel 10. For example, "left" indicates a −x direction, "right" indicates a +x direction, "upper" indicates a +y direction, and "lower" indicates a −y direction. It will be understood that the spatially relative terms such as "left," "right," "upper," and "lower" are intended to encompass different orientations of the device in use or operation in addition to the orientation depicted in the drawings. For example, the device may be otherwise oriented (rotated 90 degrees or at other orientations), and the spatially relative descriptors used herein should be interpreted accordingly.

The electronic apparatus 1 may have a rectangular shape according to a planar view. For example, the electronic apparatus 1 may have a rectangular planar shape having shorter sides in the x direction and longer sides in the y direction, as illustrated in FIG. 1. Corners between the shorter sides in the x direction and the longer sides in the y direction may be rounded to have a certain curvature or may have right angles. The planar shape of the electronic apparatus 1 is not limited to a rectangle, and may be any other suitable shape such as another polygon, an ellipse, or an irregular shape.

The cover window 70 may be above the display panel 10 to cover an upper surface of the display panel 10. Thus, the cover window 70 may function to protect the upper surface of the display panel 10.

The cover window 70 may include a transmission cover DA70 corresponding to the display panel 10, and a light-shielding cover NDA70 corresponding to an area other than the display panel 10. The light-shielding cover NDA70 may include an opaque material (e.g., colored opaque material) that shields light. In other words, the light-shielding cover NDA70 may prevent or substantially prevent the transmission of light through the light-shielding cover NDA70. The light-shielding cover NDA70 may include a pattern that may be shown to a user when no images are displayed.

The display panel 10 may be below the cover window 70. The display panel 10 may overlap the transmission cover DA70 of the cover window 70. In one or more embodiments, the transmission cover DA70 may include a transparent or translucent material such that light may pass through the transmission cover DA70.

The display panel 10 includes a display area DA, and the display area DA may include a first display area DA1 and a second display area DA2. Both the first display area DA1 and the second display area DA2 are areas where an image is displayed, and the second display area DA2 may be an area below which a component 40 such as a sensor and a camera is arranged. In one or more embodiments, the sensor may sense visible light, infrared light, sound, or the like. In an embodiment, the second display area DA2 may have a higher light transmittance and/or a higher sound transmittance than the first display area DA1. In an embodiment, when light is transmitted through the second display area DA2, a light transmittance in the second display area DA2 may be about 25% or greater, about 30% or greater, about 50% or greater, about 75% or greater, about 80% or greater, about 85% or greater, or about 90% or greater.

The display panel 10 may be a light-emitting display panel including a light-emitting diode. For example, the light-emitting diode may include an organic light-emitting diode including an organic emission layer. In some embodiments, the light-emitting diode may include an inorganic light-emitting diode including an inorganic material. The inorganic light-emitting diode may include a PN junction diode including inorganic semiconductor-based materials. When a voltage is applied to the PN junction diode in a forward direction, holes and electrons are injected and recombined to generate energy. The PN junction diode converts the generated energy into light energy to emit light of a certain color. The inorganic light-emitting diode may have a width of several micrometers to several hundred micrometers. In some embodiments, the inorganic light-emitting diode may be referred to as a micro LED.

The display panel 10 may be a rigid display panel having rigidity, and thus, not being easily bent. In one or more embodiments, the display panel 10 may be a flexible display panel having flexibility and thus being easily bent, folded, or rolled. For example, the display panel 10 may be a foldable display panel, a curved display panel having a curved display surface, a bent display panel of which an area other than a display surface is bent, a rollable display panel, or a stretchable display panel.

The display panel 10 may be a transparent display panel that is transparent so that an object or a background arranged at a side of the lower surface of the display panel 10 may be seen through the upper surface of the display panel 10. Alternatively, the display panel 10 may be a reflective display panel capable of reflecting light from an object or a background on the upper surface of the display panel 10.

A first flexible film 34 may be attached to an edge of the display panel 10. One side of the first flexible film 34 may be attached to an edge of the display panel 10 by using an anisotropic conductive film. The first flexible film 34 may be a flexible film that is bendable.

The display driver 32 may be arranged on the first flexible film 34. The display driver 32 may receive control signals and power supply voltages. In one more embodiments, the display driver 32 may generate and output signals and voltages for driving the display panel 10. The display driver 32 may be an integrated circuit (IC).

The display circuit board 30 may be attached on another side (e.g., a side opposing the side of the first flexible film 34 that be attached to an edge of the display panel 10) of the first flexible film 34. The other side of the first flexible film 34 may be attached to an upper surface of the display circuit board 30 by using an anisotropic conductive film. The display circuit board 30 may be a flexible printed circuit board (FPCB) that is bendable, a rigid PCB that has rigidity and thus is not easily bent, or a complex PCB including both a rigid PCB and an FPCB.

The touch sensor driver 33 may be arranged on the display circuit board 30. The touch sensor driver 33 may be implemented as an IC. The touch sensor driver 33 may be attached to the display circuit board. The touch sensor driver 33 may be connected (e.g., electrically connected) to touch electrodes of a touch screen layer of the display panel 10 via the display circuit board 30.

The touch screen layer of the display panel 10 may sense a touch input of a user by using at least one of several touch methods such as a resistance film method and a capacitance method. For example, when the touch screen layer of the display panel 10 senses a touch input of a user by using a capacitance method, the touch sensor driver 33 may apply driving signals to driving electrodes from among the touch electrodes and sense voltages of charges stored in a mutual capacitance (e.g., to determine a change in capacitance) between sensing electrodes from among the touch electrodes and the driving electrodes via the sensing electrodes, thereby determining whether there is a touch of a user. The touch of the user may include a contact touch and a proximity touch. Therefore, in one or more embodiments, the touch screen layer of the display panel 10 may sense a contact touch and/or a proximity touch. The contact touch indicates that a finger of a user or an object such as a stylus pen touches (e.g., directly touches) the cover window 70 arranged on the touch screen layer. The proximity touch indicates that a finger of a user or an object such as a stylus pen is located over the cover window 70 at a close distance from the cover window 70. For example, a finger of a user or an object such as a stylus pen may be hovering over the cover window 70 at a distance close to the cover window 70. The touch sensor driver 33 may transmit sensor data to a main processor 510 according to the sensed voltages, and the main processor 510 may calculate a touch coordinate at which a touch is input, by analyzing the sensor data.

A power supplier for supplying driving voltages for driving the pixels of the display panel 10, a scan driver, and the display driver 32 may be additionally arranged on the display circuit board 30. Alternatively, the power supplier may be integrated with the display driver 32. In this case, the display driver 32 and the power supplier may be implemented as a single IC.

The bracket 60 for supporting the display panel 10 may be below the display panel 10. The bracket 60 may include plastic, metal, or both plastic and metal. The bracket 60 may include a first camera hole CMH1 through which a camera 531 is inserted, a battery hole BH in which the battery 80 is arranged, and a cable hole CAH through which a cable 35 connected to the display circuit board 30 passes. The bracket 60 may also include a component hole CPH that overlaps (e.g., overlaps in a third direction (z direction)) the second display area DA2 of the display panel 10. The component hole CPH may overlap components 40 of the main circuit board 50 in the third direction (z direction). Accordingly, the second display area DA2 of the display panel 10 may overlap the components 40 of the main circuit board 50 in the third direction (z direction). The bracket 60 may not include the component hole CPH. In this case, the bracket 60 may be located not to overlap the second display area DA2 of the display panel 10 in the third direction (z direction).

The components 40 may overlap the second display area DA2 of the display panel 10. For example, the components 40 may include first, second, third, and fourth components 41, 42, 43, and 44 overlapping the second display area DA2. The first, second, third, and fourth components 41, 42, 43, and 44 may be a proximity sensor, an illumination sensor, an iris sensor, a face recognition sensor, and a camera (or an image sensor), respectively. Because the second display area DA2 of the display panel 10 may have a certain light transmittance, the proximity sensor using infrared light may detect an object arranged close to the upper surface of the electronic apparatus 1, and the illumination sensor may sense the brightness of light that is incident upon the upper surface of the electronic apparatus 1. The iris sensor may image the iris of a person arranged on the upper surface of the electronic apparatus 1, and the camera may capture an image of an object arranged on the upper surface of the electronic apparatus 1. The components 40 overlapping the second display area DA2 of the display panel 10 are not limited to a proximity sensor, an illumination sensor, an iris sensor, a face recognition sensor, and a camera. For example, the components 40 may be various other suitable sensors which may be described below.

The main circuit board 50 and the battery 80 may be arranged below the bracket 60. The main circuit board 50 may include a PCB or an FPCB.

The main circuit board 50 may include the main processor 510, the camera 531, a main connector 55, and the components 40. The main processor 510 may be implemented as an IC. The camera 531 may be arranged on both the upper and lower surfaces of the main circuit board 50, and each of the main processor 510 and the main connector 55 may be arranged on one of the upper and lower surfaces of the main circuit board 50.

The main processor 510 may control all functions of the electronic apparatus 1. For example, the main processor 510 may output digital video data to the display driver 32 via the display circuit board 30 so that the display panel 10 displays an image. The main processor 510 receives the sensor data from the touch sensor driver 33. The main processor 510 may determine whether there is a user's touch, according to the sensor data, and may execute an operation corresponding to a direct touch or proximity touch of the user. For example, the main processor 510 may calculate touch coordinates of the user by analyzing the sensor data, and may then execute an application or operation indicated by an icon touched by the user. The main processor 510 may include an application processor, a central processing unit, or a system chip each implemented as an IC.

The camera 531 processes an image frame such as a still image or moving picture obtained by the image sensor in a camera mode, and outputs a result of the processing to the main processor 510. The camera 531 may include at least one of a camera sensor (e.g., a CCD sensor or a CMOS sensor), a photo sensor (or an image sensor), and a laser sensor. The camera 531 may be connected to the image sensor from among the components 40 overlapping the second display area DA2, and may process an image input to the image sensor.

The cable 35 that passed through the cable hole CAH of the bracket 60 may be connected to the main connector 55, and accordingly, the main circuit board 50 may be connected (e.g., electrically connected) to the display circuit board 30.

The main circuit board 50 may further include, in addition to the main processor 510, the camera 531, and the main connector 55, at least one of the modules included in a wireless communicator 520, at least one of the components included in an input interface 530, at least one of the components included in a sensor 540, at least one of the components included in an output interface 550, at least one of the components included in an interface 560, a memory 570, and a power supplier 580.

The wireless communicator 520 may include at least one of a broadcast reception module 521, a mobile communication module 522, a wireless Internet module 523, a short-distance communication module 524, and a position information module 525.

The broadcast reception module 521 receives a broadcasting signal and/or broadcasting-related information from an external broadcasting management server via a broadcasting channel. The broadcasting channel may include a satellite channel, a ground wave channel, or the like.

The mobile communication module 522 transmits or receives a wireless signal to or from at least one of a base station, an external terminal, and a server on a mobile communication network established according to technology standards or communication methods for mobile communication (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), and Long Term Evolution-Advanced (LTE-A)). Examples of the wireless signal may include a voice call signal, a video call signal, and various types of data according to transmission or reception of text and/or multimedia messages.

The wireless Internet module 523 indicates a module for wireless Internet access. The wireless Internet module 523 may be configured to transmit or receive a wireless signal in a communication network based on the wireless Internet technologies. The wireless Internet technologies may be, for example, a Wireless LAN (WLAN), Wireless-Fidelity (Wi-Fi), Wi-Fi Direct, and Digital Living Network Alliance (DLNA).

The short-distance communication module 524 is for short-range communication, and thus may support short-distance communication by using at least one technology from among Bluetooth® (BLUETOOTH® is a registered trademark of Bluetooth Sig, Inc.), Radio Frequency Identification (RFID), Infrared Data Association (IrDA), Ultra Wideband (UWB), ZigBee, Near Field Communication (NFC), Wi-Fi, Wi-Fi Direct, and Wireless Universal Serial Bus (Wireless USB). The short-distance communication module 524 may support wireless communication between the electronic apparatus 1 and a wireless communication system, between the electronic apparatus 1 and another electronic apparatus, or between the electronic apparatus 1 and a network where another electronic apparatus (or an external server) is located, through wireless area networks. The wireless area networks may be wireless personal area networks. The other electronic apparatus may be a wearable device capable of exchanging data with (or interoperating with) the electronic apparatus 1.

The position information module 525 is used to obtain a position (e.g., a current position) of the electronic apparatus 1, and representative examples of the position information module 525 include a global positioning system (GPS) module and a Wi-Fi module. For example, the electronic apparatus 1 may obtain the position of the electronic apparatus 1 by using a signal transmitted by a GPS satellite, when using a GPS module. When using a Wi-Fi module, the electronic apparatus 1 may obtain the position of the electronic apparatus 1, based on information of a wireless access point (AP) that transmits or receives a wireless signal to or from the Wi-Fi module. Because the position information module 525 is used to obtain the position (e.g., the current position) of the electronic apparatus 1, the position information module 525 is not limited to a module that calculates (e.g., directly calculates) or obtains the position of the electronic apparatus 1.

The input interface 530 may include an image input interface such as the camera 531 for inputting an image signal, an audio input interface such as a microphone 532 for inputting an audio signal, and an input device 533 for receiving information from a user.

The camera 531 processes an image frame such as a still image or moving picture obtained by the image sensor in a video call mode or an image capture mode. A processed image frame may be displayed on the display panel 10 or may be stored in the memory 570.

The microphone 532 processes an external audio signal into electrical audio data. The electrical audio data may be used in various suitable ways according to a function currently being performed (or an application currently being executed) in the electronic apparatus 1. Various suitable noise removal algorithms for removing noise that is generated while receiving the external audio signal may be implemented in the microphone 532.

The main processor 510 may control an operation of the electronic apparatus 1 to correspond to information that is input via the input device 533. The input device 533 may include a mechanical input interface such as a button, a dome switch, a jog wheel, and a jog switch each located on a rear or lateral surface of the electronic apparatus 1, or a touch input interface. The touch input interface may be implemented as the touch screen layer of the display panel 10.

The sensor 540 may include at least one sensor that senses at least one of information within the electronic apparatus 1, information of a surrounding environment of the electronic apparatus 1, and user information, and generates a sensing signal corresponding to the at least one information. Based on such a sensing signal, the main processor 510 may control driving or operation of the electronic apparatus 1 or may perform data processing, a function, or an operation associated with an application provided in the electronic apparatus 1. The sensor 540 may include at least one of a proximity sensor, an illumination sensor, an acceleration sensor, a magnetic sensor, a gravity (G)-sensor, a gyroscope sensor, a motion sensor, an RGB sensor, an infrared (IR) sensor, a finger scan sensor, an ultrasonic sensor, an optical sensor, a battery gauge, an environment sensor (e.g., a barometer, a hygrometer, a thermometer, a radiation sensor, a heat sensor, and a gas sensor), and a chemical sensor (e.g., an electronic nose, a healthcare sensor, and a biometric sensor).

The proximity sensor is a sensor that senses the existence (or presence) of an object that approaches a certain sensing surface or exists (or is located) near the certain sensing surface, without mechanical contact, by using an electromagnetic force or infrared light. Examples of the proximity sensor include a transmission-type photoelectric sensor, a direct reflection-type photoelectric sensor, a mirror reflection-type photoelectric sensor, a high frequency oscillation-type proximity sensor, a capacity-type proximity sensor, a magnetic proximity sensor, and an infrared-type proximity sensor. The proximity sensor may not only sense a proximity touch operation but also may sense a proximity touch pattern such as a proximity touch distance, a proximity touch direction, a proximity touch speed, a proximity touch time, a proximity touch location, or a proximity touch moving state. The main processor 510 may process data (or information) corresponding to the proximity touch operation and the proximity touch pattern, which may both be sensed by the proximity sensor. The main processor 510 may control visual information corresponding to the processed data to be displayed on the display panel 10.

The ultrasonic sensor may recognize location information of an object by using ultrasonic waves. The main processor 510 may calculate the location of an object from information sensed by an optical sensor and a plurality of ultrasonic sensors. Because the speed of light is different from the speed of ultrasonic waves, the location of the object may be calculated using a time when light reaches the optical sensor and a time when ultrasonic waves reach the ultrasonic sensors.

The output interface 550 generates an output associated with sight, hearing, or tactile sense, and thus, may include at least one of the display panel 10, an audio output interface 551, a haptic module 552, and an optical output interface 553.

The display panel 10 displays (outputs) information that is processed by the electronic apparatus 1. For example, the display panel 10 may display execution screen information of an application being driven by the electronic apparatus 1, or may display user interface (UI) and graphic user interface (GUI) information based on the execution screen information. The display panel 10 may include a display layer that displays an image, and a touch screen layer that senses a touch input of a user. Accordingly, the display panel 10 may function as the input device 533 providing an input interface between the electronic apparatus 1 and a user, and also function as the output interface 550 providing an output interface between the electronic apparatus 1 and the user.

The audio output interface 551 may output audio data received from the wireless communicator 520 in a call signal reception mode, a call or recording mode, a voice recognition mode, a broadcast reception mode, and the like, or audio data stored in the memory 570. The audio output interface 551 also outputs an audio signal related with a function performed by the electronic apparatus 1 (e.g., a call signal receiving sound or a message receiving sound). The audio output interface 551 may include a receiver and a speaker. At least one of the receiver and the speaker may be an audio generation device that is attached to a lower portion of the display panel 10 and vibrates the display panel 10 to output an audio. The audio generation device may be a piezoelectric element or piezoelectric actuator that shrinks and expands according to an electrical signal, or an exciter that generates a magnetic force by using a voice coil and vibrates the display panel 10.

The haptic module 552 generates various tactile effects that a user may feel. The haptic module 552 may provide a user with vibration as a tactile effect. The intensity, pattern, and the like of vibration generated by the haptic module 552 may be controlled according to a user's selection or settings of the main processor 510. For example, the haptic module 552 may synthesize different vibrations and output a result of the synthesis, or may sequentially output the different vibrations. The haptic module 552 may generate, in addition to vibrations, various other suitable tactile effects such as an effect due to a pin arrangement moving (e.g., vertically moving) with respect to a skin surface, a jet force or suction force of the air through a nozzle or inlet, grazing of the skin surface, a contact of an electrode, and a stimulus (e.g., an electrostatic force). In one or more embodiments, the haptic module 552 may generate an effect due to reproduction or stimulation of cold and/or warmth senses by using an element capable of heat absorption and/or heat emission. The haptic module 552 may transmit a tactile effect through contact (e.g., direct contact), and may also be implemented such that a user may feel a tactile effect through a muscle sense of a finger, an arm, or the like.

The optical output interface 553 outputs a signal for notifying occurrence of an event, by using the light of a light source. Examples of the event generated in the electronic apparatus 1 may include message reception, call signal reception, a missed call, an alarm, schedule notification, e-mail reception, and information reception through an application. The signal output by the optical output interface 553 is implemented as the electronic apparatus 1 emits light of a single color or light beams of a plurality of colors to its front surface or rear surface. The outputting of the signal may be terminated when the electronic apparatus 1 senses that a user confirms an event.

The interface 560 serves as a passage with various suitable types of external apparatuses that are connected to the electronic apparatus 1. The interface 560 may include at least one of a wired/wireless headset port, an external charger port, a wired/wireless data port, a memory card port, a port connecting a device including an identification module, an audio input/output (I/O) port, a video I/O port, and an earphone port. When an external apparatus is connected to the interface 560, the electronic apparatus 1 may perform an appropriate or suitable control related with the connected external apparatus.

The memory 570 may store data that supports various functions of the electronic apparatus 1. The memory 570 may store a plurality of application programs driven by the electronic apparatus 1, pieces of data for operations of the electronic apparatus 1, and instructions. At least some of the application programs may be downloaded from an external server through wireless communication. However, the present disclosure is not limited thereto. For example, applications may be downloaded from any suitable source through any suitable means of communication. The memory 570 may store an application for an operation of the main processor 510, and may temporarily store input/output data (e.g., a phone book, a message, a still image, and a moving picture). The memory 570 may also store haptic data for various patterns of vibration that are provided to the haptic module 552, and audio data about various sounds that are provided to the audio output interface 551. The memory 570 may include at least one type of storage medium selected from among a flash memory type, a hard disk type, a solid state disk (SSD) type, a silicon disk drive (SDD) type, a multimedia card micro type, a card type memory (e.g., a secure digital (SD) or extreme digital (XD) memory), a random access memory (RAM), a static random access memory (SRAM), a read-only memory (ROM), an electrically erasable programmable ROM (EEPROM), a programmable ROM (PROM), magnetic memory, a magnetic disk, and an optical disk.

Under the control of the main processor 510, the power supplier 580 receives external power and internal power and supplies the external and internal power to the components included in the electronic apparatus 1. The power supplier 580 may include the battery 80. The power supplier 580 includes a connection port that may be an example of the interface 560 to which an external charger supplying power to charge a battery is connected (e.g., electrically connected). Alternatively, the power supplier 580 may be configured to charge the battery 80 in a wireless manner without using a connection port. The battery 80 may receive power from an external wireless power transmission device by using at least one of an inductive coupling method based on a magnetic induction phenomenon or a magnetic resonance coupling method based on an electromagnetic resonance phenomenon. The battery 80 may be arranged to not overlap the main circuit board 50 in the third direction (z direction). The battery 80 may overlap the battery hole BH of the bracket 60.

The lower cover 90 may be arranged below the main circuit board 50 and the battery 80. The lower cover 90 may be fastened to the bracket 60 and fixed in place. The lower cover 90 may form the outer appearance of the lower surface of the electronic apparatus 1. In other words, the lower cover 90 may form an external surface of the electronic apparatus 1. The lower cover 90 may include plastic, metal, or both plastic and metal.

A second camera hole CMH2 via which the lower surface of the camera 531 is exposed may be provided in the lower cover 90. In one or more embodiments, the second camera hole CMH2 may extend through the lower cover 90. The location of the camera 531 and the locations of the first and second camera holes CMH1 and CMH2 corresponding to the camera 531 are not limited to the embodiment of FIGS. 1 and 2. For example, the camera 531, the first camera hole CMH1, and the second camera hole CMH2 may be located at any other suitable location of the electronic apparatus 1.

Figure 4A:
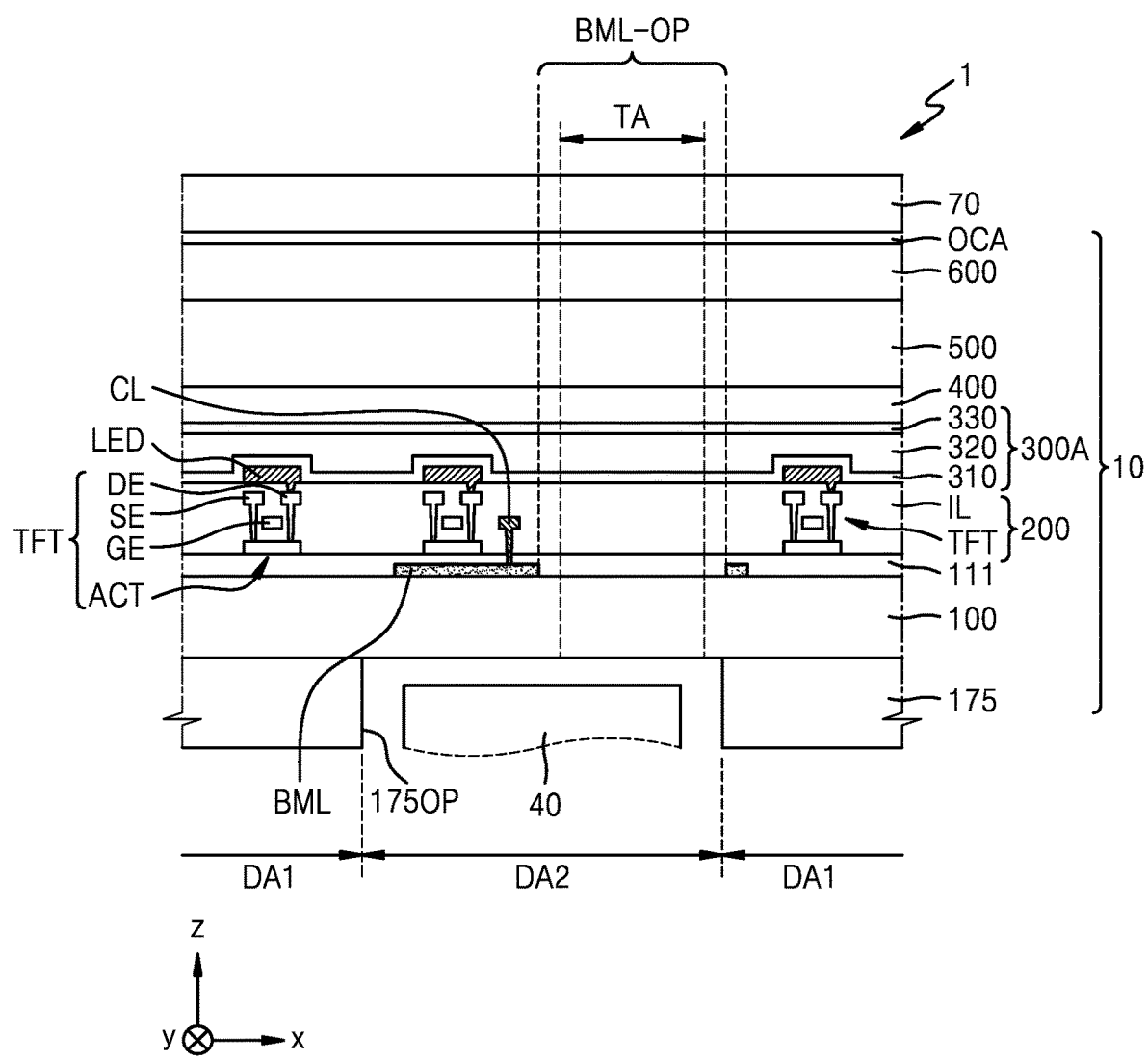
FIGS. 4A and 4B are cross-sectional views of a portion of an electronic apparatus according to an embodiment.
Figure 4B:
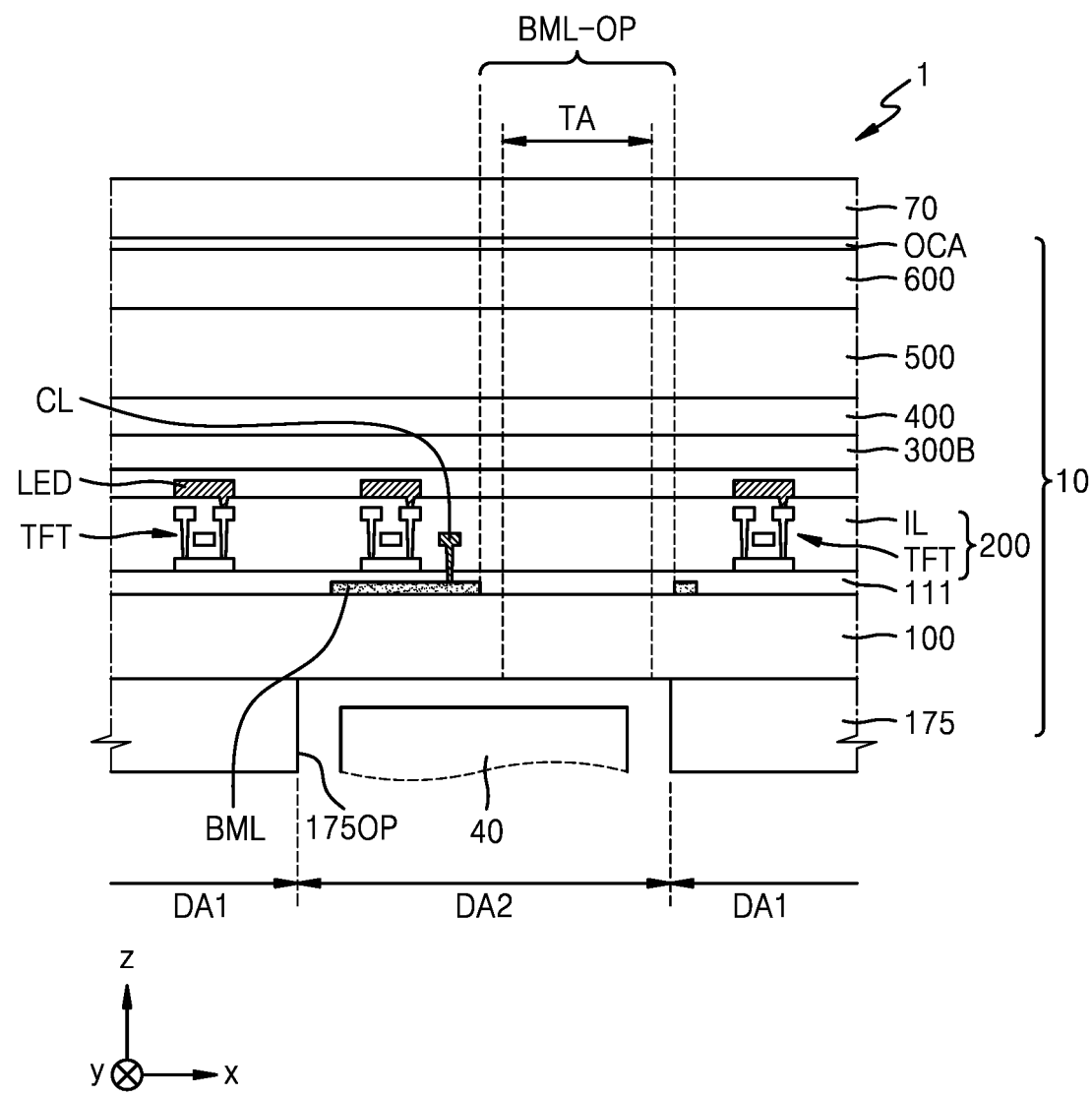

FIGS. 4A and 4B are cross-sectional views of a portion of an electronic apparatus 1 according to an embodiment.

Referring to FIG. 4A, a display panel 10 may include a substrate 100, a display layer 200, a thin-film encapsulation layer 300A, an input sensing layer 400, an optical functional layer 500, and an anti-reflective layer 600. A window 70 may be arranged on the anti-reflective layer 600 via an adhesive layer such as an optical clear adhesive (OCA).

The substrate 100 may include glass or a polymer resin. For example, the polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including an inorganic layer and a layer including the above-described polymer resin.

The display layer 200 may be arranged on a front surface of the substrate 100, and a lower protective film 175 may be arranged on a rear surface of the substrate 100. The lower protective film 175 may be attached to the rear surface of the substrate 100. An adhesive layer may be between the lower protective film 175 and the substrate 100. Alternatively, the lower protective film 175 may be arranged (e.g., directly arranged) on the rear surface of the substrate 100. In this case, an adhesive layer may not be between the lower protective film 175 and the substrate 100.

The lower protective film 175 may support and protect the substrate 100. The lower protective film 175 may include a first opening 175OP corresponding to a second display area DA2. The first opening 175OP of the lower protective film 175 is a concave portion formed by removing a portion of the lower protective film 175 in a thickness direction. In some embodiments, the first opening 175OP of the lower protective film 175 may be formed by removing the lower protective film 175 completely in the thickness direction. For example, a portion of the lower protective film 175 may be completely removed in the thickness direction to form the first opening 175OP of the lower protective film 175.

Because the first opening 175OP is provided in the lower protective film 175, transmittance of the second display area DA2 and transmittance of a transmission area TA may be improved, for example. The lower protective film 175 may include an organic insulating material such as polyethylene terephthalate (PET) or polyimide (PI).

The display layer 200 may include a plurality of pixels. The pixels may each include a display element and emit red light, green light, or blue light. The display element may include a light-emitting diode (LED). The light-emitting diode LED may include an organic light-emitting diode or an inorganic light-emitting diode (micro LED).

The display layer 200 may include a display element layer including a light-emitting diode LED as a display element, a circuit layer including a thin-film transistor TFT connected (e.g., electrically connected) to the light-emitting diode LED, a buffer layer 111 between the substrate 100 and the circuit layer, and an insulating layer IL between the display element layer and the circuit layer. The thin-film transistor TFT and the light-emitting diode LED connected (e.g., electrically connected) to the thin-film transistor TFT may be arranged in each of the first display area DA1 and the second display area DA2. The thin-film transistor TFT may include a semiconductor layer ACT, a gate electrode GE, a source electrode SE, and a drain electrode DE.

The second display area DA2 may include at least one transmission area TA in which the thin-film transistor TFT and the light-emitting diode LED are not arranged. Light emitted from a component 40 and/or light directed to the component 40 may be transmitted through the transmission area TA.

A blocking layer BML may be between the substrate 100 and the display layer 200 (e.g., between the substrate 100 and the thin-film transistor TFT in the third direction (z direction) or between the substrate 100 and the buffer layer 111 in the third direction (z direction)). The blocking layer BML may include at least one opening BML-OP through which light emitted from the component 40 or directed to the component 40 passes. The opening BML-OP of the blocking layer BML may be located in or at the transmission area TA to allow movement of light emitted from or directed to the component 40. For example, a portion of the opening BML-OP may correspond to the transmission area TA such that light may pass through the portion of the opening BML-OP and the corresponding transmission area TA. A metal material portion (metal portion) of the blocking layer BML prevents or substantially prevents light from diffracting through a gap (e.g., a narrow gap) between thin-film transistors TFT arranged in the second display area DA2 or a gap (e.g., a narrow gap) between lines connected to the thin-film transistors TFT.

The blocking layer BML may be connected to a connection line CL. The connection line CL may be a portion of the gate electrode GE, the source electrode SE, or the drain electrode DE of the thin-film transistor TFT, or may be a line connected (e.g., electrically connected) to the gate electrode GE, the source electrode SE, or the drain electrode DE of the thin-film transistor TFT. The blocking layer BML may have the same voltage level as that of the gate electrode GE, the source electrode SE, or the drain electrode DE via the connection line CL. When the blocking layer BML has a certain voltage level, the blocking layer BML may prevent or reduce performance degradation of the thin-film transistor TFT or improve the performance of the thin-film transistor TFT.

The display layer 200 may be sealed with an encapsulation member. In some embodiments, the encapsulation member may include a thin-film encapsulation layer 300A as illustrated in FIG. 4A. The thin-film encapsulation layer 300A may include at least one inorganic encapsulation layer and at least one organic encapsulation layer. In an embodiment, the thin-film encapsulation layer 300A may include first and second inorganic encapsulation layers 310 and 330 and an organic encapsulation layer 320 therebetween.

In some embodiments, the encapsulation member may include an encapsulation substrate 300B as illustrated in FIG. 4B. The encapsulation substrate 300B may be arranged to face the substrate 100 with the display layer 200 therebetween. A gap may exist between the encapsulation substrate 300B and the display layer 200. The encapsulation substrate 300B may include glass. A sealant may be arranged between the substrate 100 and the encapsulation substrate 300B. The sealant may completely surround the display area (e.g., the display area DA as illustrated in the embodiment of FIG. 2) including the first display area DA1 and the second display area DA2, thereby preventing or substantially preventing moisture from penetrating through the side surface of the display area DA.

The input sensing layer 400 may obtain coordinate information according to an external input (e.g., a touch event of an object such as a finger or a stylus pen). The input sensing layer 400 may include a touch electrode, and trace lines connected to the touch electrode. The input sensing layer 400 may sense an external input using a mutual-capacitance method or a self-capacitance method.

The input sensing layer 400 may be arranged on the encapsulation member. Alternatively, the input sensing layer 400 may be separately formed and then bonded to the encapsulation member through an adhesive layer such as OCA. In an embodiment, the input sensing layer 400 may be formed on (e.g., directly on) the thin-film encapsulation layer 300A as illustrated in FIG. 4A or the encapsulation substrate 300B as illustrated in FIG. 4B. In this case, the adhesive layer may not be between the input sensing layer 400 and the thin-film encapsulation layer 300A or the encapsulation substrate 300B.

The optical functional layer 500 may improve light efficiency. For example, front light efficiency and/or side visibility of light emitted from the light-emitting diode LED may be improved.

The anti-reflective layer 600 may reduce reflectance of light (e.g., external light) from the outside, directed toward the display panel 10, and incident on the anti-reflective layer 600. In some embodiments, the anti-reflective layer may include an optical plate including a retarder and/or a polarizer. The retarder may be a film type retarder or a liquid crystal coating type retarder and may include a λ/2 retarder and/or a λ/4 retarder. The polarizer may also be a film type polarizer or a liquid crystal coating type polarizer. The film type polarizer may include a stretched synthetic resin film, and the liquid crystal coating type polarizer may include liquid crystals arranged in a certain array. The anti-reflective layer 600 may include an opening overlapping the transmission area TA.

In some embodiments, the anti-reflective layer 600 may include a filter plate including a black matrix and color filters. The filter plate may include color filters arranged for each pixel and a black matrix surrounding the color filters. In one or more embodiments, the black matrix may be located between adjacent ones of the color filters and separate the color filters from each other.

In some embodiments, the anti-reflective layer 600 may include a destructive interference structure. The destructive interference structure may include a first reflective layer and a second reflective layer, which are arranged on different layers. First reflected light and second reflected light, which are respectively reflected from the first reflective layer and the second reflective layer, may destructively interfere with each other. Thus, reflectance of external light may be reduced.

The window 70 may be arranged on the anti-reflective layer 600 and bonded to the anti-reflective layer 600 via an adhesive layer such as an OCA. FIGS. 4A and 4B illustrate that the window 70 is arranged on the anti-reflective layer 600, but in some embodiments, the positions of the anti-reflective layer 600 and the optical functional layer 500 may be changed. For example, the positions of the anti-reflective layer 600 and the optical functional layer 500 may be swapped with each other. In this case, the window 70 may be bonded to the optical functional layer 500 via an adhesive layer such as an OCA. In some embodiments, the OCA may be omitted between the window 70 and the layer (e.g., the anti-reflective layer 600 or the optical functional layer 500) under the window 70.

FIGS. 5A-5H are schematic plan views of a display panel according to an embodiment.

Figure 5A:
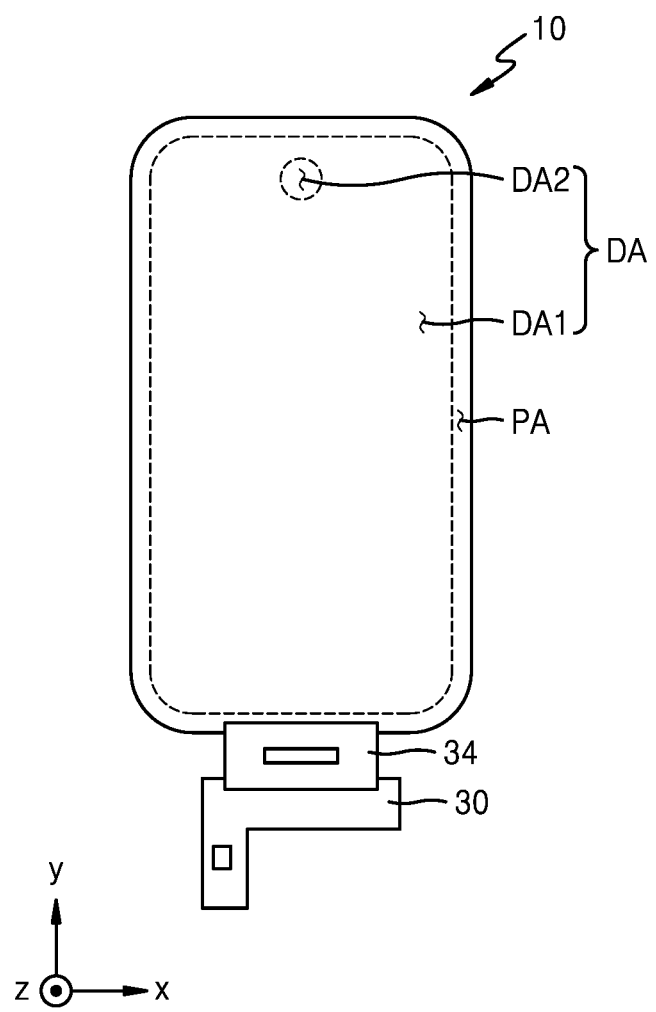
FIGS. 5A-5H are schematic plan views of a display panel according to an embodiment.

FIGS. 5A-5H illustrate various arrangements of a display area DA included in the display panel. The display area DA may be entirely surrounded by a peripheral area PA. As described above, a pad portion may be arranged in the peripheral area PA, and as illustrated in FIG. 5A, a display circuit board 30 may be connected (e.g., electrically connected) to the pad portion of the peripheral area PA via a first flexible film 34 in the peripheral area PA.

The display area DA may include a first display area DA1 and a second display area DA2. The second display area DA2 may be a component area in which a component 40 is arranged, as described above with reference to FIGS. 4A and 4B.

Referring to FIGS. 5A-5E, the second display area DA2 may be arranged inside the first display area DA1 and may be entirely surrounded by the first display area DA1. The second display area DA2 may have a circular shape in a plan view. However, the present disclosure is not limited thereto, and in other embodiments, the second display area DA2 may have any other suitable shape. For example, the second display area DA2 may have a polygonal shape such as an elliptical shape or a quadrangular shape.

Figure 5B:
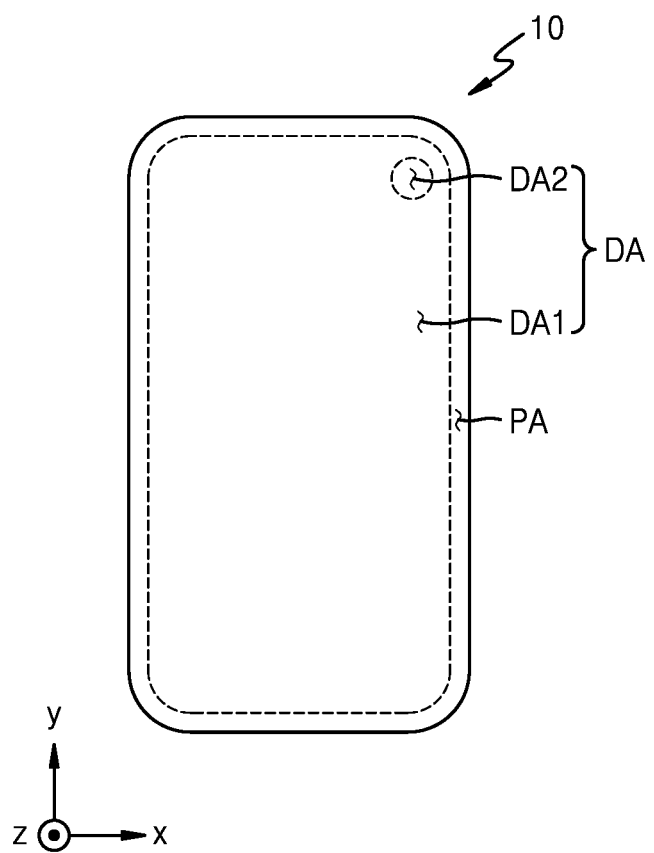
Figure 5C:
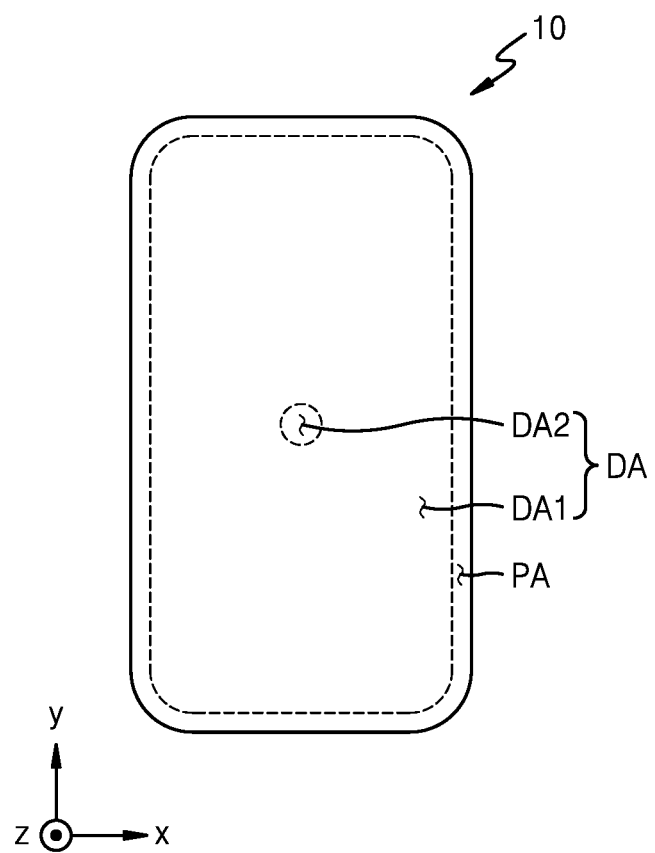

The second display area DA2 may be arranged in the center of the upper portion of the display area DA in a plan view as illustrated in FIG. 5A. The second display area DA2 may be arranged in the upper right of the display area DA in a plan view as illustrated in FIG. 5B. Alternatively, the second display area DA2 may be arranged at the central portion of the display area DA in a plan view as illustrated in FIG. 5C. In this case, when a component arranged to correspond to the second display area DA2 includes a camera, a user's gaze for self-photography and video call may be natural.

Figure 5D:
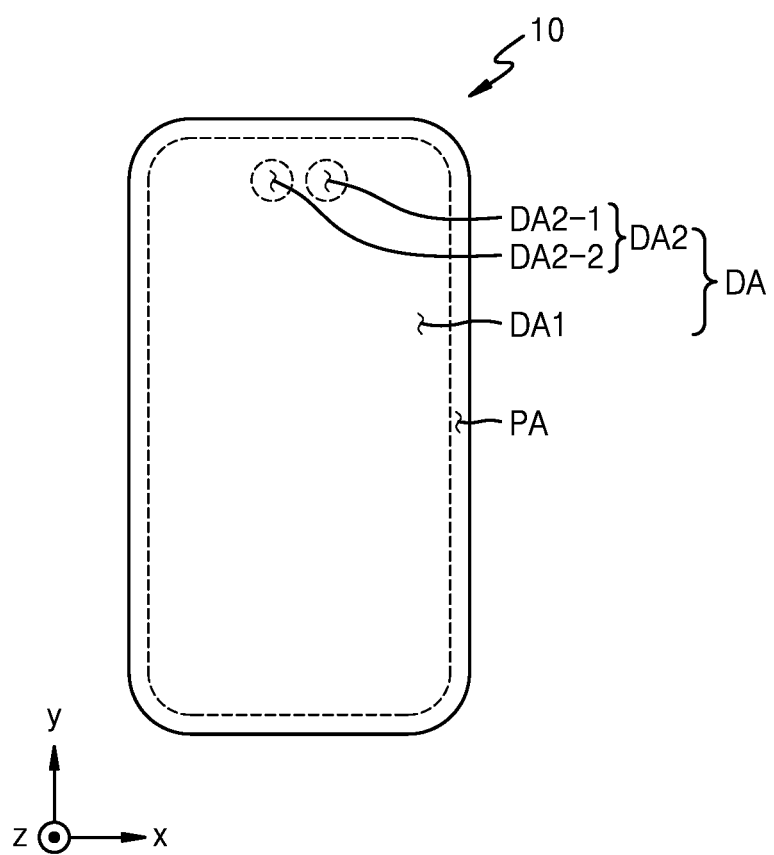
Figure 5E:
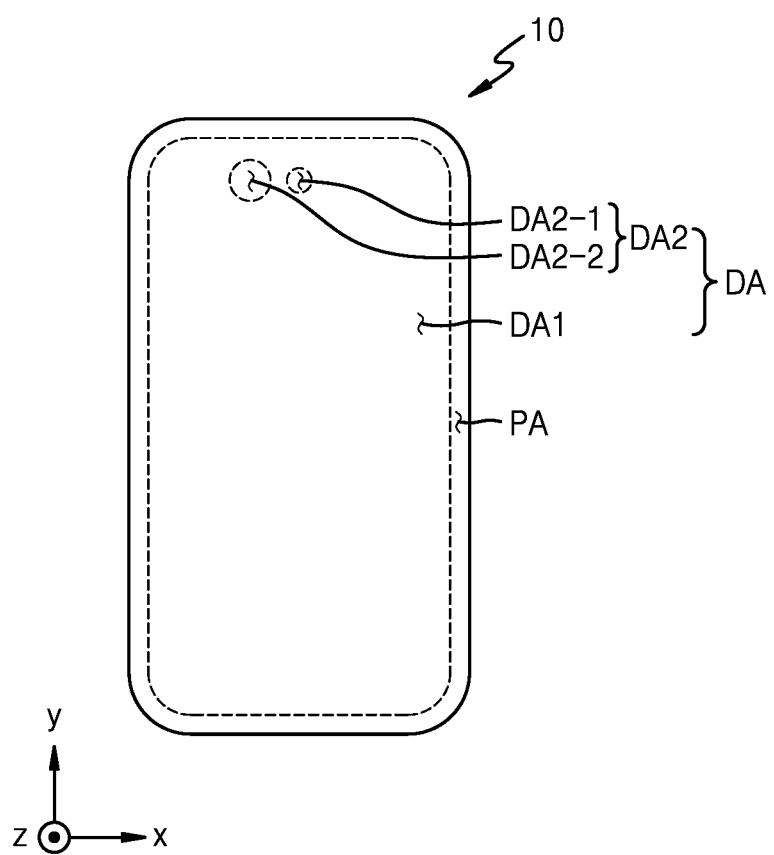

As illustrated in FIGS. 5D and 5E, the second display area DA2 may include two or more sub-display areas arranged adjacent to each other. As an embodiment, FIGS. 5D and 5E illustrate a first sub-display area DA2-1 and a second sub-display area DA2-2. As illustrated in FIGS. 5D and 5E, the first sub-display area DA2-1 and the second sub-display area DA2-2 may be arranged adjacent to each other in an x direction. In other embodiments, the first sub-display area DA2-1 and the second sub-display area DA2-2 may be arranged adjacent to each other in a y direction. The first sub-display area DA2-1 and the second sub-display area DA2-2 may have the same size as illustrated in FIG. 5D or may have different sizes as illustrated in FIG. 5E. For example, as illustrated in FIG. 5E, the first sub-display area DA2-1 may be smaller in size than the second sub-display area DA2-2. However, the present disclosure is not limited thereto. For example, any suitable size arrangement may be provided as desired.

Figure 5F:
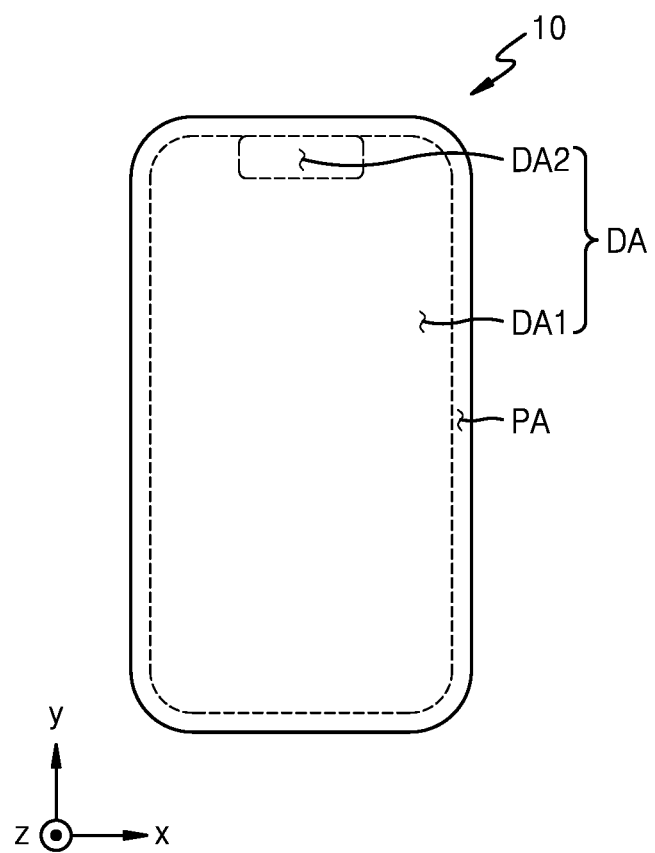
Figure 5G:
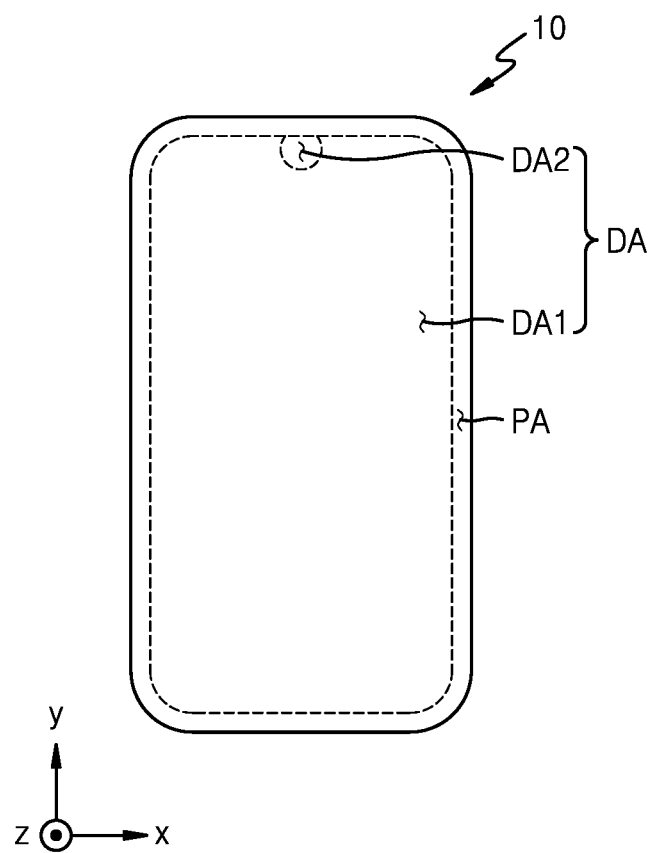
Figure 5H:
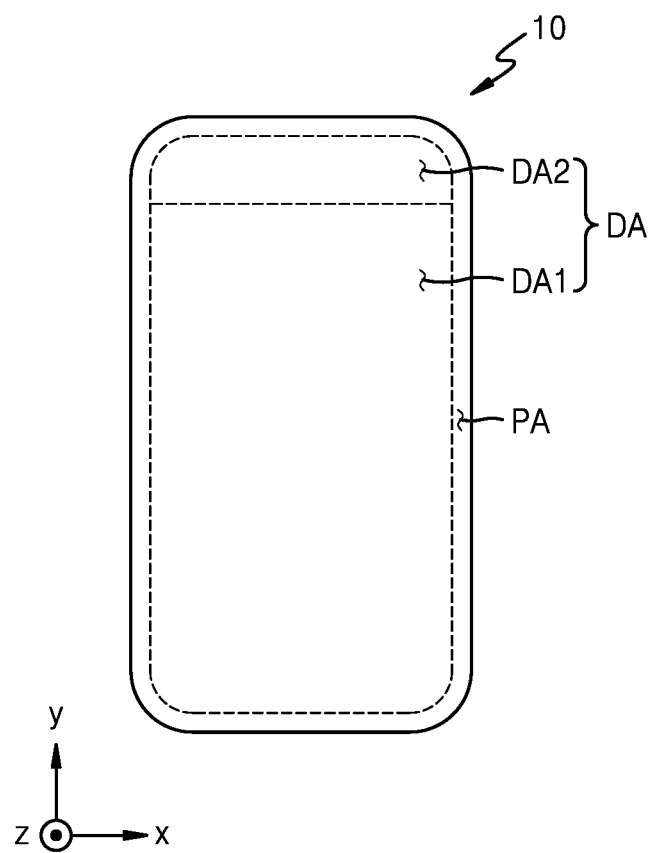

As illustrated in FIGS. 5F-5H, the second display area DA2 may be arranged at one side of the first display area DA1, and the second display area DA2 may be partially surrounded by the first display area DA1 such that one side of the second display area DA2 is adjacent (e.g., directly adjacent) to the peripheral area PA. For example, one side of the second display area DA2 may be directly adjacent to the peripheral area PA and the other sides of the second display area DA2 may be directly adjacent to the first display area DA1.

As illustrated in FIGS. 5F and 5G, the second display area DA2 may be a notch-type display area that is concave toward the center from one side of the display area DA. The notch may be provided in various shapes, such as a rectangle, a semicircle, and a semi-ellipse. As illustrated in FIG. 5H, the second display area DA2 may be a bar type display area extending in the x direction. For example, the second display area DA2 may be a bar type display area extending from one side of the display area to the opposite side of the display area DA2.

Figure 6A:
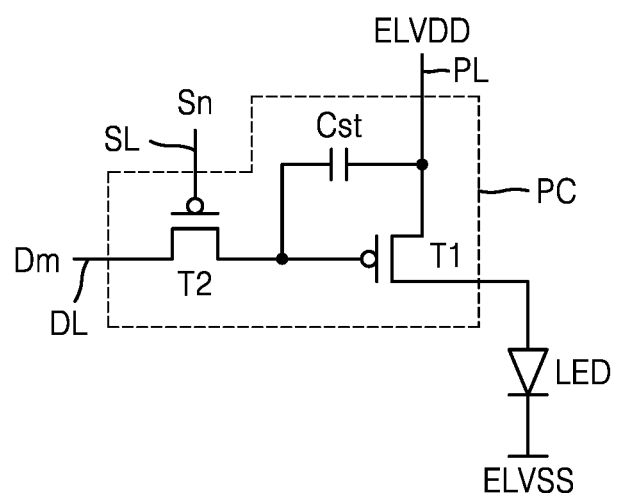
FIGS. 6A and 6B are circuit diagrams of a pixel circuit connected to a light-emitting diode of a display panel, according to an embodiment.
Figure 6B:
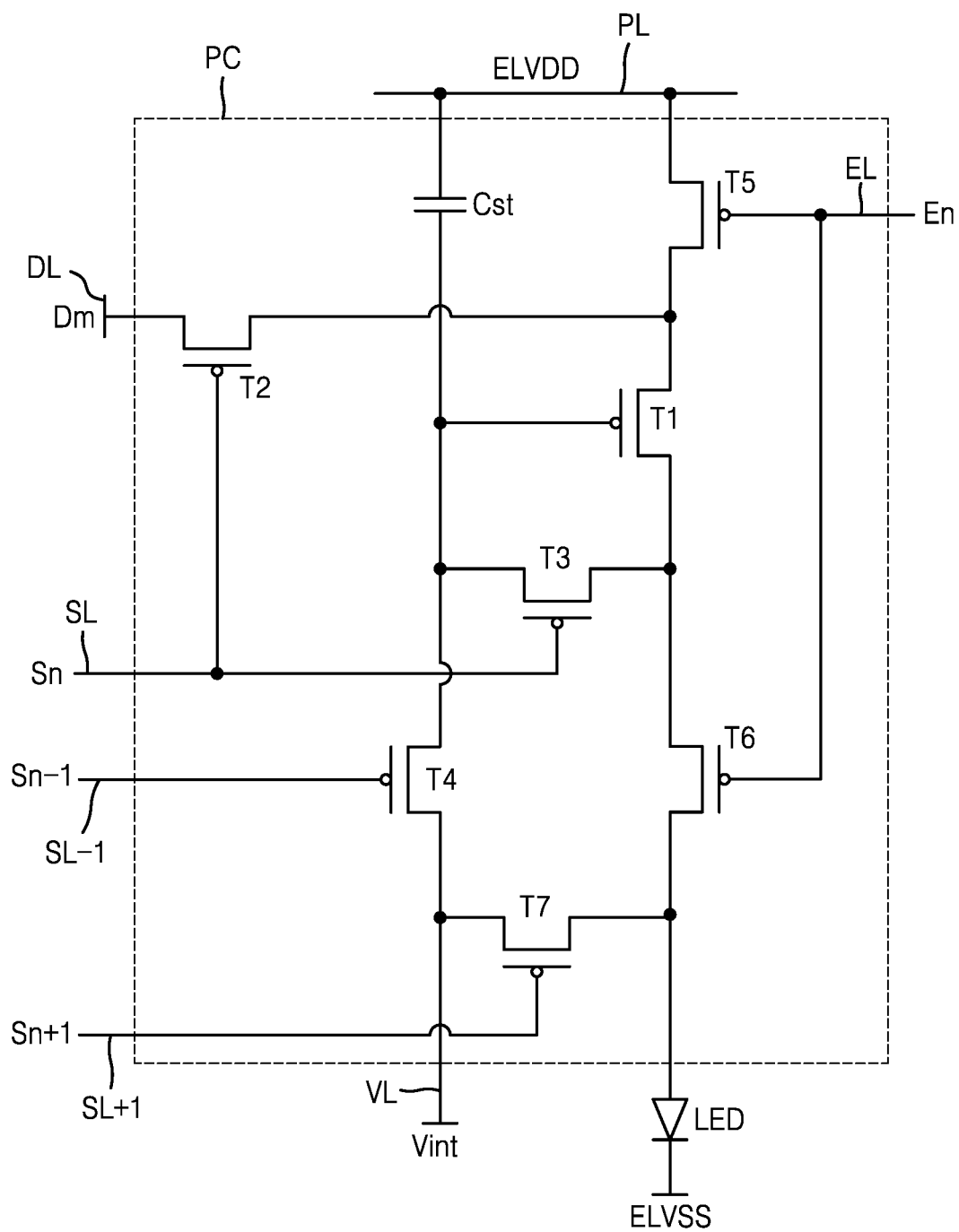

FIGS. 6A and 6B are circuit diagrams of a pixel circuit PC connected to a light-emitting diode LED of a display panel, according to an embodiment.

Referring to FIG. 6A, the light-emitting diode LED may be connected (e.g., electrically connected) to the pixel circuit PC. The pixel circuit PC may include a first thin-film transistor T1, a second thin-film transistor T2, and a storage capacitor Cst.

The second thin-film transistor T2 is a switching thin-film transistor that may be connected to a scan line SL and a data line DL and configured to transfer, to the first thin-film transistor T1, a data voltage (or a data signal) Dm input from the data line DL based on a switching voltage (or a switching signal) Sn input from the scan line SL. The storage capacitor Cst may be connected to the second thin-film transistor T2 and a driving voltage line PL and configured to store a voltage corresponding to a difference between a voltage received from the second thin-film transistor T2 and a first power supply voltage ELVDD supplied to the driving voltage line PL.

The first thin-film transistor T1 is a driving thin-film transistor that may be connected to the driving voltage line PL and the storage capacitor Cst and configured to control a driving current flowing from the driving voltage line PL to the light-emitting diode LED according to a voltage value stored in the storage capacitor Cst. The light-emitting diode LED may emit light having a certain luminance according to the driving current. An opposite electrode (e.g., a cathode) of the light-emitting diode LED may be configured to receive a second power supply voltage ELVSS.

A case in which the pixel circuit PC includes two thin-film transistors and one storage capacitor has been described with reference to FIG. 6A, but the disclosure is not limited thereto. The number of thin-film transistors and the number of storage capacitors may be variously changed in a suitable manner according to the design of the pixel circuit PC. For example, the pixel circuit PC may include three or more thin-film transistors.

Referring to FIG. 6B, the pixel circuit PC may include a first thin-film transistor T1, a second thin-film transistor T2, a third thin-film transistor T3, a fourth thin-film transistor T4, a fifth thin-film transistor T5, a sixth thin-film transistor T6, a seventh thin-film transistor T7, and a storage capacitor Cst.

The first and second thin-film transistors T1 and T2 are the same as described above with reference to FIG. 6A. For example, the first thin-film transistor T1 may receive a data signal Dm according to the switching operation of the second thin-film transistor T2 to supply a driving current to a light-emitting diode LED. The second thin-film transistor T2 may be turned on according to a scan signal Sn received through a scan line SL to perform the switching operation to transfer the data signal Dm on a data line DL to the first thin-film transistor T1.

The third thin-film transistor T3 is a compensation thin-film transistor, and a gate electrode of the third thin-film transistor T3 may be connected to the scan line SL. A source electrode (or a drain electrode) of the third thin-film transistor T3 may be connected to a drain electrode (or a source electrode) of the first thin-film transistor T1 and connected to a pixel electrode of the light-emitting diode LED through the sixth thin-film transistor T6. The drain electrode (or the source electrode) of the third thin-film transistor T3 may be connected to one electrode of the storage capacitor Cst, a source electrode (or a drain electrode) of the fourth thin-film transistor T4, and a gate electrode of the first thin-film transistor T1. The third thin-film transistor T3 may be turned on according to the scan signal Sn received through the scan line SL to connect the gate electrode and the drain electrode of the first thin-film transistor T1 to each other such that the first thin-film transistor T1 is diode-connected.

The fourth thin-film transistor T4 is an initialization thin-film transistor, and a gate electrode of the fourth thin-film transistor T4 may be connected to a previous scan line SL−1. The drain electrode (or the source electrode) of the fourth thin-film transistor T4 may be connected to an initialization voltage line VL. The source electrode (or the drain electrode) of the fourth thin-film transistor T4 may be connected to one electrode of the storage capacitor Cst, the drain electrode (or the source electrode) of the third thin-film transistor T4, and the gate electrode of the first thin-film transistor T1. The fourth thin-film transistor T4 may be turned on according to a previous scan signal Sn−1 received through the previous scan line SL−1 to perform an initialization operation to transfer an initialization voltage Vint to the gate electrode of the first thin-film transistor T1 so as to initialize the voltage of the gate electrode of the first thin-film transistor T1.

The fifth thin-film transistor T5 is an operation control thin-film transistor, and a gate electrode of the fifth thin-film transistor T5 may be connected to an emission control line EL. A source electrode (or a drain electrode) of the fifth thin-film transistor T5 may be connected to the driving voltage line PL. The drain electrode (or the source electrode) of the fifth thin-film transistor T5 may be connected to the source electrode (or the drain electrode) of the first thin-film transistor T1 and a drain electrode (or a source electrode) of the second thin-film transistor T2.

The sixth thin-film transistor T6 is an emission control thin-film transistor, and a gate electrode of the sixth thin-film transistor T6 may be connected to the emission control line EL. A source electrode (or a drain electrode) of the sixth thin-film transistor T6 may be connected to the drain electrode (or the source electrode) of the first thin-film transistor T1 and the third electrode (or the drain electrode) of the third thin-film transistor T3. The drain electrode (or the source electrode) of the sixth thin-film transistor T6 may be connected (e.g., electrically connected) to the pixel electrode of the light-emitting diode LED. The fifth thin-film transistor T5 and the sixth thin-film transistor T6 may be concurrently (e.g., simultaneously) turned on according to an emission control signal En received through the emission control line EL to transfer a driving voltage ELVDD to the light-emitting diode LED such that the driving current flows through the light-emitting diode LED.

The seventh thin-film transistor T7 may be an initialization thin-film transistor that initializes the pixel electrode of the light-emitting diode LED. A gate electrode of the seventh thin-film transistor T7 may be connected to a next scan line SL+1. A source electrode (or a drain electrode) of the seventh thin-film transistor T7 may be connected to the pixel electrode of the light-emitting diode LED. The drain electrode (or the source electrode) of the seventh thin-film transistor T7 may be connected to the initialization voltage line VL. The seventh thin-film transistor T7 may be turned on according to a next scan signal Sn+1 received through the next scan line SL+1 to initialize the pixel electrode of the light-emitting diode LED.

FIG. 6B illustrates a case in which the fourth thin-film transistor T4 and the seventh thin-film transistor T7 are respectively connected to the previous scan line SL−1 and the next scan line SL+1, but in another embodiment, both the fourth thin-film transistor T4 and the seventh thin-film transistor T7 are connected to the previous scan line SL−1 and driven according to the previous scan signal Sn−1.

The other electrode of the storage capacitor Cst may be connected to the driving voltage line PL. Any one electrode of the storage capacitor Cst may be connected to the gate electrode of the first thin-film transistor T1, the drain electrode (or the source electrode) of the third thin-film transistor T3, and the source electrode (or the drain electrode) of the fourth thin-film transistor T4.

The opposite electrode (e.g., the cathode) of the light-emitting diode LED may receive a common voltage ELVSS. The light-emitting diode LED may receive the driving current from the first thin-film transistor T1 and emit light.

Figure 7:
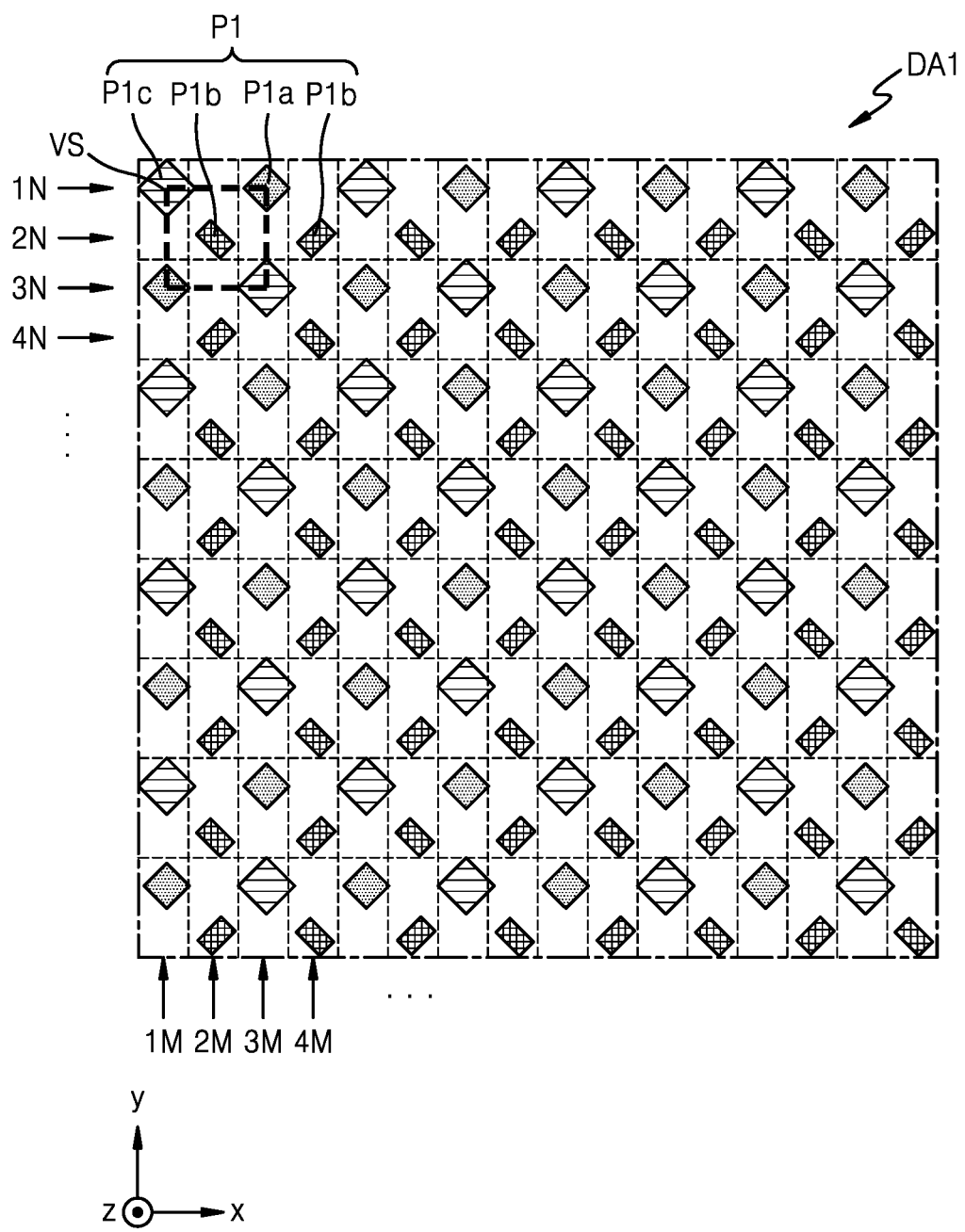
FIG. 7 is a plan view of a portion of a first display area of a display panel, according to an embodiment.

FIG. 7 is a plan view of a portion of a first display area DA1 of a display panel, according to an embodiment.

Referring to FIG. 7, first pixels P1 may be arranged in the first display area DA1. The first pixels P1 may include a first color pixel P1a, a second color pixel P1b, and a third color pixel P1c. The first color, the second color, and the third color may be different colors. For example, the first color may be red, the second color may be green, and the third color may be blue.

In some embodiments, the first color pixel P1a, the second color pixel P1b, and the third color pixel P1c may be arranged in a Pentile® type or shape (PENTILE® is a registered trademark of Samsung Display Co., Ltd., Republic of Korea).

First color pixels P1a and third color pixels P1c may be alternately arranged in a first row 1N. Second color pixels P1b may be apart from and/or spaced from each other at certain intervals in an adjacent second row 2N. Third color pixels P1c and first color pixels P1a may be alternately arranged in an adjacent third row 3N. Second color pixels Pm2 may be apart from and/or spaced from each other at certain intervals in an adjacent fourth row 4N. Such pixel arrangement may be repeated up to an $N^{th}$ row. In this case, the size (or width) of the third color pixel P1c and the first color pixel P1a may be greater than the size (or width) of the second color pixel P1b.

The first color pixels P1a and the third color pixel P1c arranged in the first row 1N and the second color pixels P1b arranged in the second row 2N may be alternately arranged. Therefore, the first color pixels P1a and the third color pixels P1c may be alternately arranged in a first column 1M. The second color pixels P1b may be apart from and/or spaced from each other at certain intervals in a second column 2M. The third color pixels P1c and the first color pixels P1a may be alternately arranged in a third column 3M. The second color pixels P1b may be apart from and/or spaced from each other at certain intervals in a fourth column 4M. Such pixel arrangement may be repeated up to an $M^{th}$ column.

The pixel arrangement structure may be expressed differently as follows: the first color pixels P1a are arranged at first and third vertices facing each other from among the vertices of a virtual rectangle VS having a center point of the second color pixel P1b as a center point of a rectangle, and the third color pixels P1c are arranged at second and fourth vertices that are the other vertices. In this case, the virtual rectangle VS may be modified in various suitable forms, such as a rectangle, a rhombus, and a square.

Such a pixel arrangement structure is referred to as a Pentile® Matrix structure or a Pentile® structure, and high resolution may be implemented with a small number of pixels by applying a rendering driving that expresses colors by sharing adjacent pixels.

Although FIG. 7 illustrates that the first pixels P1 in the first display area DA1 are arranged in the Pentile® matrix structure, the disclosure is not limited thereto. For example, the first pixels P1 including the first color pixel P1a, the second color pixel P1b, and the third color pixel P1c, may be arranged in various suitable shapes, such as a stripe structure, a mosaic arrangement structure, or a delta arrangement structure.

Figure 8:
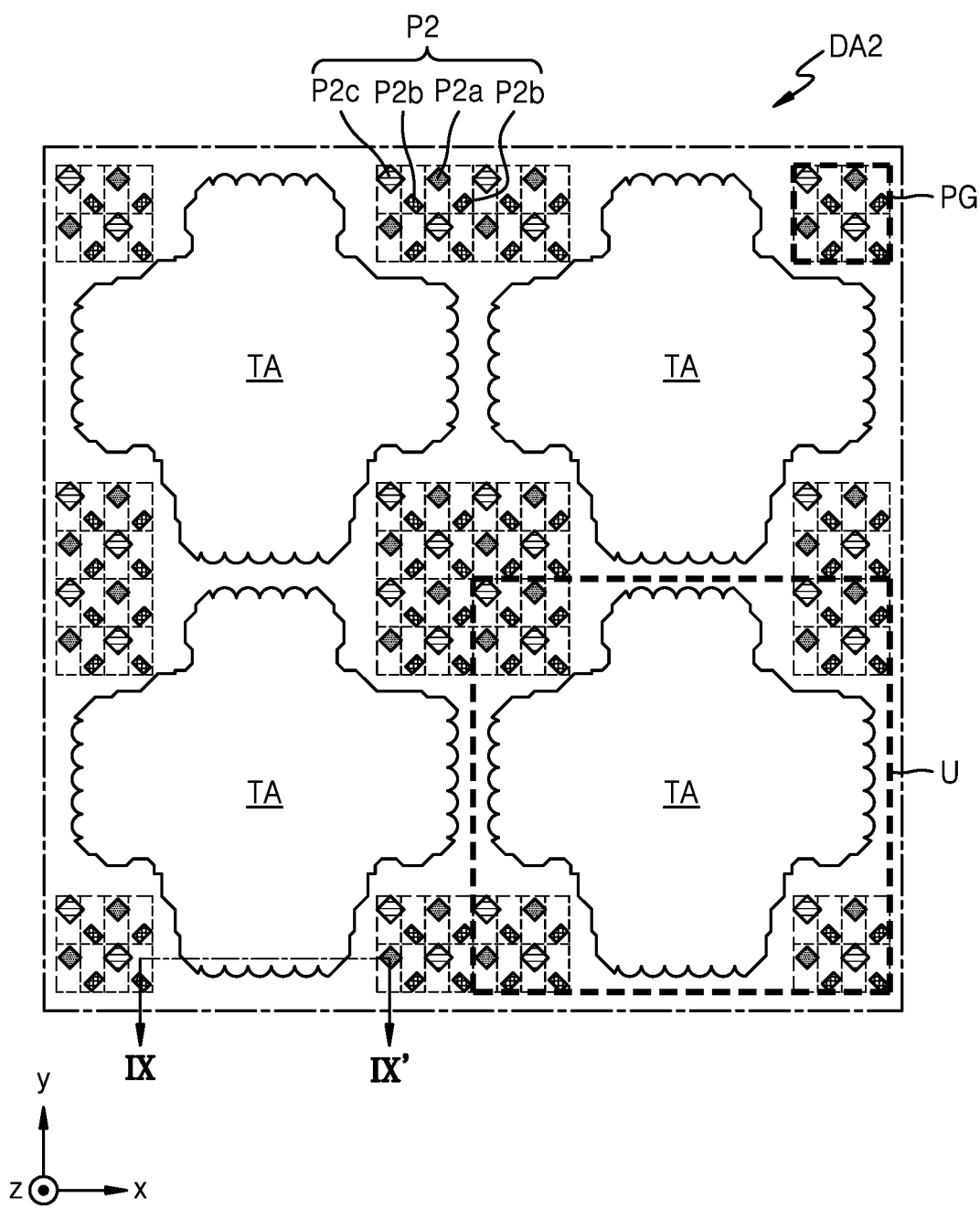
FIG. 8 is a plan view of a portion of a second display area of a display panel, according to an embodiment.

FIG. 8 is a plan view of a portion of a second display area DA2 of a display panel, according to an embodiment.

Referring to FIG. 8, second pixels P2 may be arranged in the second display area DA2. The second pixels P2 may include a first color pixel P2a, a second color pixel P2b, and a third color pixel P2c. The first color, the second color, and the third color may be different colors. For example, the first color may be red, the second color may be green, and the third color may be blue.

In an embodiment, the first color pixel P2a, the second color pixel P2b, and the third color pixel P2c may be arranged in a Pentile® matrix structure, similar to the first color pixel P1a, the second color pixel P1b, and the third color pixel P1c described above with reference to FIG. 7. In another embodiment, the first color pixel P2a, the second color pixel P2b, and the third color pixel P2c may have an arrangement structure different from the arrangement structure of the first color pixel P1a, the second color pixel P1b, and the third color pixel P1c arranged in the first display area (e.g., the first display area DA1 shown in the embodiment of FIG. 7). For example, the first color pixel P2a, the second color pixel P2*b*, and the third color pixel P2*c* may have a stripe structure, a mosaic arrangement structure, or a delta arrangement structure.

The second display area DA2 may include a transmission area TA. The transmission areas TA may be apart from and/or spaced from each other and may be arranged two-dimensionally in the x direction and the y direction. The second pixels P2 may be arranged around the transmission area TA. For example, the second pixels P2 may constitute a certain group (hereinafter referred to as a pixel group PG) and may be arranged around the transmission area TA.

The pixel group PG may be defined as a bundle in which the second pixels P2 are grouped in preset or set units. For example, one pixel group PG may include eight second pixels P2 arranged in a Pentile® structure. FIG. 8 illustrates that one pixel group PG includes two first color pixels P2*a*, four second color pixels P2*b*, and two third color pixels P2*c*.

The transmission area TA may be between the pixel groups PG. For example, the transmission area TA may be between two adjacent pixel groups PG in the x-direction, the y-direction, or the direction oblique to the x-direction and the y-direction.

The transmission area TA is an area through which light is transmitted, as described above with reference to FIG. 2A and the like, and is an area in which the second pixels P2 are not arranged. In one or more embodiments, the transmission area TA may have a higher light transmittance than the display area DA. Referring to FIG. 8, one unit U may include one transmission area TA and pixel groups PG therearound. In other words, the transmission area TA may be at the center of the one unit U. In one or more embodiments, the pixel groups PG may be at respective corners of the one unit U. In one unit U, the area occupied by the transmission area TA and the area occupied by the pixel groups PG have a trade-off relationship.

For example, when a component requires a large amount of light, the area occupied in one unit U by the transmission area TA may be relatively increased, and the area occupied in one unit U by the pixel groups PG may be relatively reduced. Alternatively, when a component requires a small amount of light, the area occupied in one unit U by the transmission area TA may be relatively reduced, and the area occupied in one unit U by the pixel groups PG may be relatively increased. In other words, the transmission area TA and the pixel groups PG may occupy the one unit U such that increasing the transmission area TA decreases the available area for the pixel groups PG and vice versa. In an embodiment, FIG. 8 illustrates that the area occupied in one unit U by the pixel groups PG is about ¼ of the area of the unit U. However, in another embodiment, the area occupied in one unit U by the pixel groups PG may be greater than about ¼ of the area of the unit U.

As illustrated in FIG. 8, the transmission area TA may have a substantially cross shape and may have uneven edges. In another embodiment, the transmission area TA may have a circular (elliptical or polygonal) shape as a whole and have uneven edges.

Figure 9:
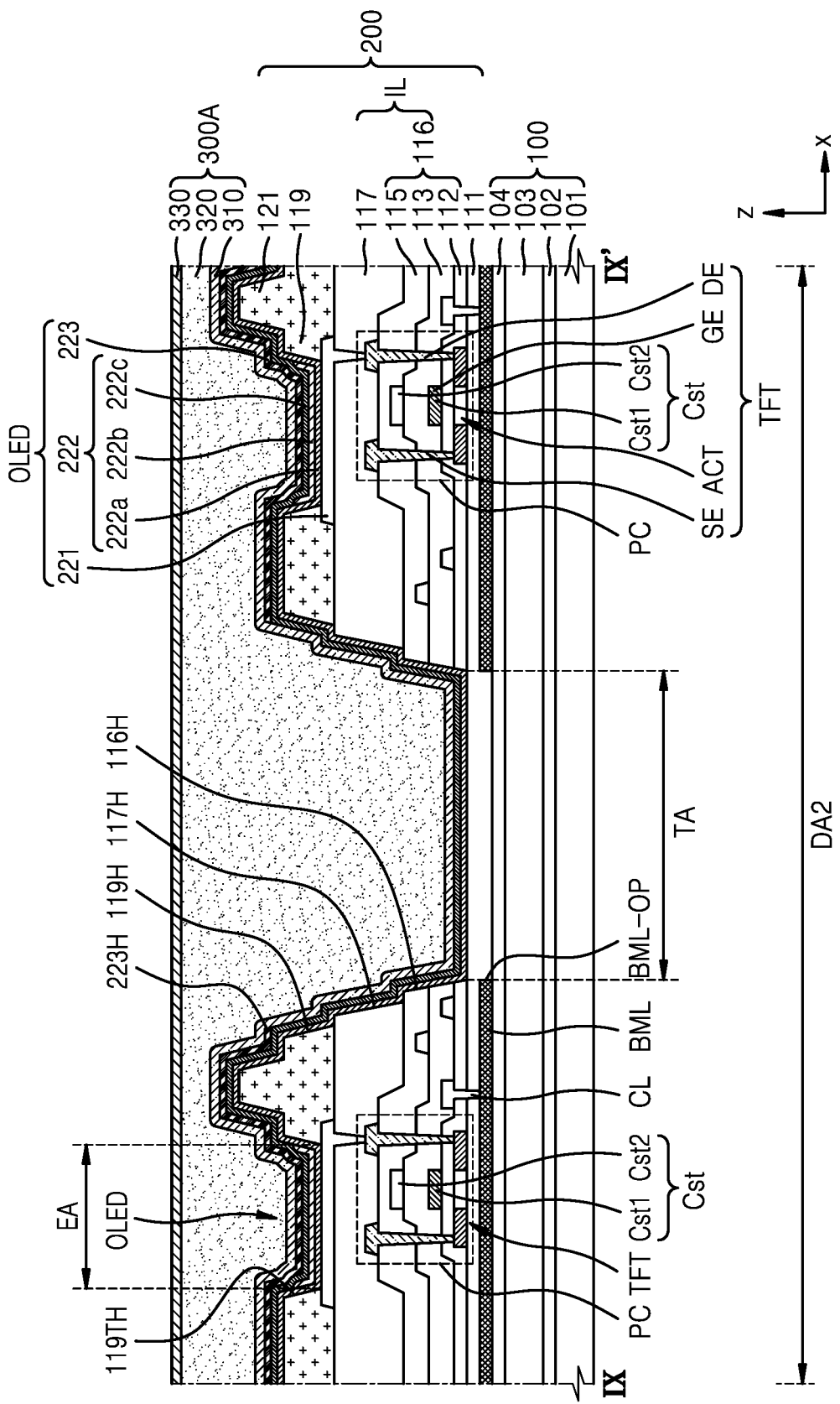
FIG. 9 is a cross-sectional view of a display panel, taken along line IX-IX' of FIG. 8, according to an embodiment.

FIG. 9 is a cross-sectional view of a display panel, taken along the line IX-IX' of FIG. 8, according to an embodiment.

Referring to FIG. 9, a substrate 100 may have a multi-layer structure. The substrate 100 may include a first base layer 101, a first barrier layer 102, a second base layer 103, and a second barrier layer 104, which are sequentially stacked in this stated order.

The first base layer 101 and the second base layer 103 may each include a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The first barrier layer 102 and the second barrier layer 104 may include an inorganic insulating material such as silicon oxide, silicon oxynitride, or silicon nitride. FIG. 9 illustrates that the substrate 100 has the multi-layer structure described above, but in another embodiment, the substrate 100 may include a single layer such as a glass material.

A buffer layer 111 may reduce or block penetration of foreign matter, moisture, or external air from the bottom of the substrate 100 and may provide a flat surface on the substrate 100. The buffer layer 111 may include an inorganic insulating material such as silicon oxide, silicon oxynitride, and silicon nitride, and may include a single layer or a multi-layer including the above-described materials.

The blocking layer BML may be between the substrate 100 and a pixel circuit PC to be described below, for example, between the substrate 100 and the buffer layer 111. The blocking layer BML may include an opening BML-OP corresponding to the transmission area TA. The blocking layer BML may include a conductive metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

The blocking layer BML may be connected (e.g., electrically connected) to a connection line CL. The connection line CL may be connected (e.g., electrically connected) to a gate electrode, a source electrode, or a drain electrode of a thin-film transistor TFT, or may be connected (e.g., electrically connected) to any one storage plate of a storage capacitor Cst to be described below. Alternatively, the connection line CL may be connected (e.g., electrically connected) to a driving voltage line (e.g., driving voltage line PL in FIGS. 6A and 6B). The connection line CL may connect (e.g., electrically connect) the blocking layer BML to the gate electrode, the source electrode, or the drain electrode of the thin-film transistor TFT, or may connected (e.g., electrically connect) the blocking layer BML to any one storage plate of the storage capacitor Cst or the driving voltage line. The blocking layer BML connected to the connection line CL may protect the thin-film transistor TFT from external static electricity or may improve the performance of the thin-film transistor TFT.

The pixel circuit PC including the thin-film transistor TFT and the storage capacitor Cst may be arranged on the buffer layer 111. The thin-film transistor TFT may include a semiconductor layer ACT, a gate electrode GE overlapping a channel region of the semiconductor layer ACT, and a source electrode SE and a drain electrode DE respectively connected to a source region and a drain region of the semiconductor layer ACT. A gate insulating layer 112 may be between the semiconductor layer ACT and the gate electrode GE, and a first interlayer insulating layer 113 and a second interlayer insulating layer 115 may be between the gate electrode GE and the source electrode SE or between the gate electrode GE and the drain electrode DE.

The storage capacitor Cst may be arranged to overlap the thin-film transistor TFT in the thickness direction (e.g., the z direction). The storage capacitor Cst may include a first storage plate Cst1 and a second storage plate Cst2 overlapping each other in the thickness direction (e.g., the z direction). In some embodiments, the gate electrode GE of the thin-film transistor TFT may include the first storage plate Cst1 of the storage capacitor Cst. The first interlayer insulating layer 113 may be between the first storage plate Cst1 and the second storage plate Cst2.

The semiconductor layer ACT may include polysilicon. In some embodiments, the semiconductor layer ACT may include amorphous silicon. In some embodiments, the semiconductor layer ACT may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer ACT may include a channel region, and a source region and a drain region doped with impurities.

The gate insulating layer 112 may include an inorganic insulating material such as silicon oxide, silicon oxynitride, or silicon nitride, and may include a single layer or a multi-layer including the above-described materials.

The gate electrode GE or the first storage plate Cst1 may include a low-resistance conductive material such as molybdenum (Mo), aluminum (Al), copper (Cu), and/or titanium (Ti) and may include a single layer or a multi-layer including the above-described materials.

The first interlayer insulating layer 113 may include an inorganic insulating material such as silicon oxide, silicon oxynitride, or silicon nitride, and may include a single layer or a multi-layer including the above-described materials.

The second storage plate Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or a multi-layer including the above-described materials.

The second interlayer insulating layer 115 may include an inorganic insulating material such as silicon oxide, silicon oxynitride, or silicon nitride, and may include a single layer or a multi-layer including the above-described materials.

The source electrode SE or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or a multi-layer including the above-described materials. For example, the source electrode SE or the drain electrode DE may have a three-layer structure including a titanium layer, an aluminum layer, and a titanium layer, which are sequentially stacked in this stated order.

A planarization insulating layer 117 may include a material different from that of at least one inorganic insulating layer 116 arranged thereunder, for example, the gate insulating layer 112, the first interlayer insulating layer 113, and the second interlayer insulating layer 115. The planarization insulating layer 117 may include an organic insulating material such as acryl, benzocyclobutene (BCB), polyimide, or hexamethyldisiloxane (HMDSO).

A pixel electrode 221 may be arranged on the planarization insulating layer 117. The pixel electrode 221 may be connected (e.g., electrically connected) to the thin-film transistor TFT through a contact hole formed in the planarization insulating layer 117.

The pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compounds thereof. The pixel electrode 221 may include a reflective layer including the above-described materials, and a transparent conductive layer arranged above or/and under the reflective film. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 221 may have a three-layer structure including an ITO layer, an Ag layer, and an ITO layer, which are sequentially stacked in this stated order.

A pixel defining layer 119 may cover the edge of the pixel electrode 221 and may include a hole 119TH exposing the center portion of the pixel electrode 221. The pixel defining layer 119 may include an organic insulating material such as benzocyclobutene (BCB), polyimide, or hexamethyldisiloxane (HMDSO). The hole 119TH of the pixel defining layer 119 may define an emission area EA, and red, green, or blue light may be emitted through the emission area EA. The area or width of the emission area EA may define the area or width of the pixel.

A spacer 121 may be arranged on the pixel defining layer 119. The spacer 121 may prevent or protect layers under the spacer 121 from being damaged by a mask in a process of forming an intermediate layer 222 to be described below. The spacer 121 may include the same material as that of the pixel defining layer 119.

The intermediate layer 222 may include an emission layer 222b overlapping the pixel electrode 221 in the thickness direction (e.g., the z direction). The emission layer 222b may include an organic material. The emission layer 222b may include a high molecular weight organic material or a low molecular weight organic material that emits light of a certain color. As described above, the emission layer 222b may be formed through a deposition process using a mask.

A first functional layer 222a and a second functional layer 222c may be arranged under and above the emission layer 222b, respectively. In other embodiments, the first functional layer 222a and the second functional layer 222c may be arranged under or above the emission layer 222b.

The first functional layer 222a may include a single layer or a multi-layer. For example, when the first functional layer 222a includes a high molecular weight material, the first functional layer 222a is a hole transport layer (HTL) having a single-layer structure and may include poly-(3,4)-ethylene-dioxy thiophene (PEDOT) or polyaniline (PANI). When the first functional layer 222a includes a low molecular weight material, the first functional layer 222a may include a hole injection layer (HIL) and an HTL.

When the first functional layer 222a and the emission layer 222b include a high molecular weight material, the second functional layer 222c may be formed. The second functional layer 222c may include a single layer or a multi-layer. The second functional layer 222c may include an electron transport layer (ETL) and/or an electron injection layer (EIL).

Each of the first functional layer 222a and the second functional layer 222c may be integrally formed to cover the entire display area. As illustrated in FIG. 9, the first functional layer 222a and the second functional layer 222c may be integrally formed over the display area.

The opposite electrode 223 may include a conductive material having a relatively low work function. For example, the opposite electrode 223 may include a (semi)transparent layer including silver (Ag), magnesium (Mg), aluminum (Al), nickel (Ni), chromium (Cr), lithium (Li), calcium (Ca), or any alloys thereof. Alternatively, the opposite electrode 223 may further include a layer such as ITO, IZO, ZnO, or $In_2O_3$ on the (semi)transparent layer including the above-described materials. In an embodiment, the opposite electrode 223 may include silver (Ag) and magnesium (Mg).

The opposite electrode 223 may include a fourth hole 223H located in the transmission area TA.

A stack of the pixel electrode 221, the intermediate layer 222, and the opposite electrode 223 may form a light-emitting diode, for example, an organic light-emitting diode OLED. The display layer 200 including the pixel circuit PC, the insulating layers, and the organic light-emitting diode OLED may be covered with a thin-film encapsulation layer 300A.

The thin-film encapsulation layer 300A may include first and second inorganic encapsulation layers 310 and 330 and an organic encapsulation layer 320 therebetween.

The first and second inorganic encapsulation layers 310 and 330 may each include one or more inorganic insulating materials. The one or more inorganic insulating materials may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed through chemical vapor deposition.

The organic encapsulation layer 320 may include a polymer-based material. The polymer-based material may include an acryl-based resin, an epoxy-based resin, polyimide, polyethylene, and the like. For example, the organic encapsulation layer 320 may include an acryl-based resin, for example, polymethyl methacrylate, polyacrylic acid, or the like. The organic encapsulation layer 320 may be formed by curing a monomer or applying a polymer.

Because the second display area DA2 includes the transmission area TA, FIG. 9 illustrates that two pixel circuits PC and two organic light-emitting diodes OLED are arranged adjacent to each other with the transmission area TA therebetween (e.g., therebetween in a direction (e.g., the x direction) normal or perpendicular to the thickness direction).

The insulating layers IL above the substrate 100, for example, at least one inorganic insulating layer 116, the planarization insulating layer 117, and the pixel defining layer 119, may include holes corresponding to the transmission area TA. The at least one inorganic insulating layer 116 may include at least one selected from the gate insulating layer 112, the first interlayer insulating layer 113, and the second interlayer insulating layer 115.

A first hole 116H of the at least one inorganic insulating layer 116, a second hole 117H of the planarization insulating layer 117, and a third hole 119H of the pixel defining layer 119 may overlap each other in the transmission areas TA. The opposite electrode 223 may also include a fourth hole 223H located in the transmission area TA. The fourth hole 223H may overlap the first hole 116H, the second hole 117H, and the third hole 119H. The first hole 116H may have a through hole shape passing through the stack of the gate insulating layer 112, the first interlayer insulating layer 113, and the second interlayer insulating layer 115, or may have a blind hole shape formed by partially removing the above-described stack in the thickness direction of the above-described stack. The second hole 117H, the third hole 119H, and the fourth hole 223H may each have a through hole shape. The first hole 116H, the second hole 117H, the third hole 119H, and the fourth hole 223H may have different sizes and widths.

The buffer layer 111 and the second barrier layer 104 may not include holes located in the transmission area TA. For example, as illustrated in FIG. 9, the buffer layer 111 and the second barrier layer 104 may cover the transmission area TA. In some other embodiments, the buffer layer 111 and/or the second barrier layer 104 may include holes located in the transmission area TA.

Figure 10:
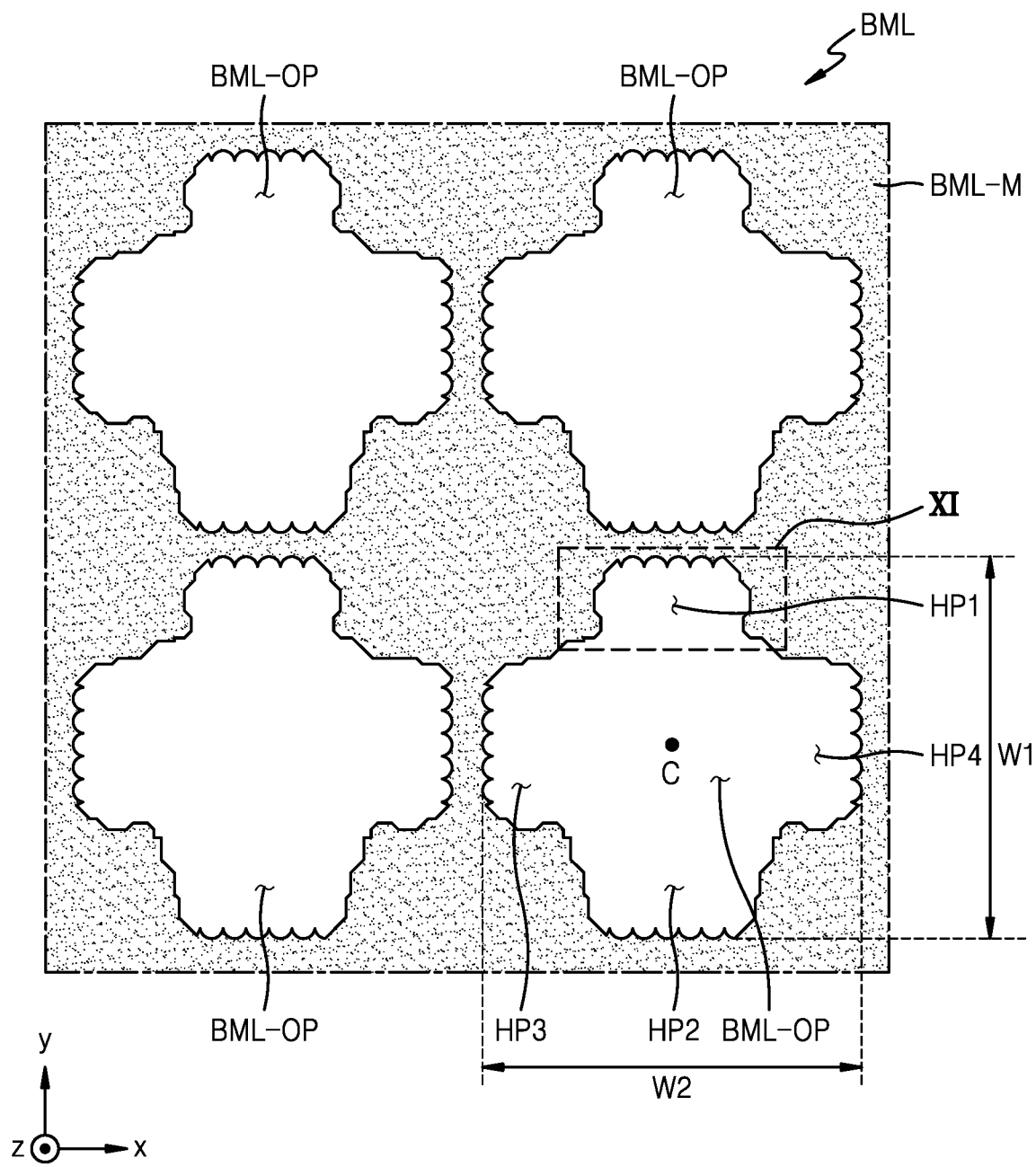
FIG. 10 is a schematic plan view of a blocking layer of a display panel, according to an embodiment.
Figure 11A:
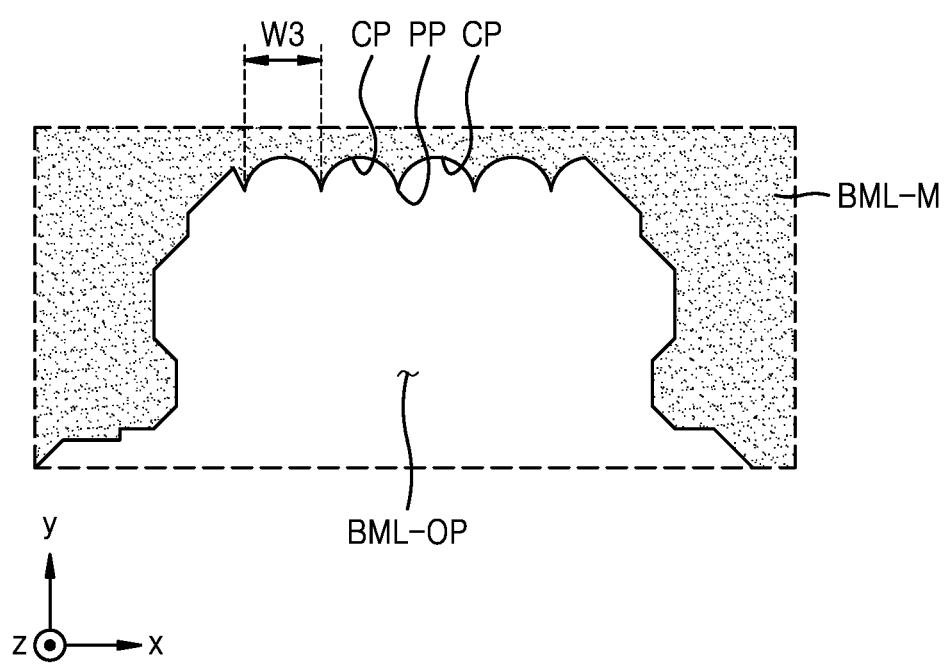
FIGS. 11A and 11B are enlarged plan views of portion XI of FIG. 10.
Figure 11B:
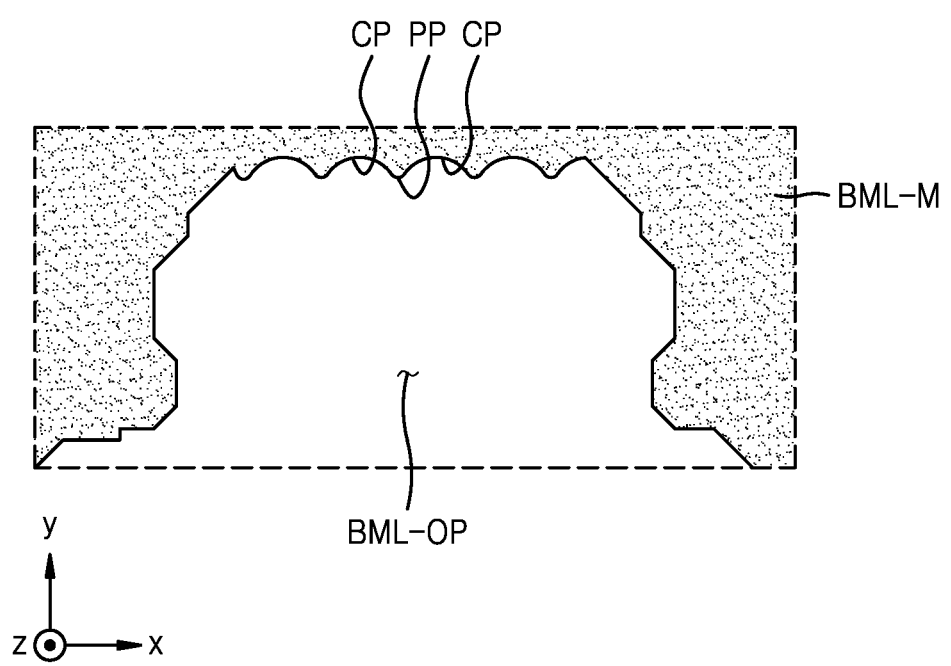

FIG. 10 is a schematic plan view of a blocking layer BML of a display panel, according to an embodiment, and FIGS. 11A and 11B are enlarged plan views of portion XI of FIG. 10.

Referring to FIG. 10, the blocking layer BML may include a plurality of openings BML-OP apart from and/or spaced from each other. The openings BML-OP may be apart from and/or spaced from each other in the x direction and the y direction, and the openings BML-OP may each be surrounded (e.g., entirely surrounded) by a metal portion BML-M.

The opening BML-OP may have a cross shape as a whole. The opening BML-OP may include portions extending in the horizontal direction and the vertical direction with respect to the center C of the opening BML-OP. In one or more embodiments, the horizontal direction and the vertical direction may be perpendicular to or normal to each other. A first portion HP1 and a second portion HP2 of the opening BML-OP may be located at opposite sides of the opening BML-OP in the y direction with the center C of the opening BML-OP therebetween, and a third portion HP3 and a fourth portion HP4 may be located at opposite sides of the opening BML-OP in the x direction with the center C of the opening BML-OP therebetween.

The opening BML-OP may include uneven (e.g., concave and convex) edges. As illustrated in FIGS. 10, 11A, and 11B, the edges of the opening BML-OP may have a structure in which convex portions CP are arranged adjacent to each other in a direction away from the center C of the opening BML-OP. The edges of the opening BML-OP may include a structure in which convex portions CP are arranged continuously and/or regularly. Concave portions PP facing the center C of the opening BML-OP may be provided between the adjacent convex portions CP. The concave portion PP may have a relatively pointed shape as illustrated in FIG. 11A or a relatively rounded shape as illustrated in FIG. 11B. For example, the concave portion PP may form a pointed end as illustrated in FIG. 11A or may form a curved or rounded end as illustrated in FIG. 11B.

A width (W3) of the convex portion CP (hereinafter referred to as a third width) may be less than or equal to about 10% of the maximum width (W1) of the opening BML-OP in the y direction (hereinafter referred to as a first width) and/or the maximum width (W2) of the opening BML-OP in the x direction (hereinafter referred to as a second width). For example, the third width W3 may be selected in a range of about 5% to about 10% of the first width W1 and/or the second width W2. In some embodiments, the third width W3 may be about 10 μm to about 20 μm.

As illustrated in FIGS. 11A and 11B, the convex portion CP may have a substantially semi-circular shape. In another embodiment, the convex portion CP may have various suitable shapes such as a substantially semi-elliptical shape, a substantially triangular shape, or a substantially quadrangular shape.

When the edge of the opening BML-OP (or the edge of the metal portion BML-M defining the opening BML-OP) includes a plurality of convex portions CP, it is possible to minimize or reduce diffraction of light traveling to the component through the opening (BML-OP). Therefore, it is possible to sufficiently secure the resolution of light received by the component.

The characteristics of the edge of the first portion HP1 of the opening BML-OP described with reference to FIGS. 11A and 11B may be equally applied to other edges of the opening BML-OP. For example, the second to fourth portions (the second portion HP2, the third portion HP3, and the fourth portion HP4) of the opening BML-OP may each include a structure in which convex portions CP are arranged continuously and/or regularly.

Because the opening BML-OP is defined by the edges of the metal portion BML-M of the blocking layer BML, the edges of the opening BML-OP may be the edges of the metal portion BML-M. Therefore, when the edges of the opening BML-OP are uneven (e.g., concave and convex) edges, the edges of the opening BML-OP may indicate that the edges of the metal portion BML-M defining the opening BML-OP are uneven (e.g., concave and convex) edges.

Figure 12:
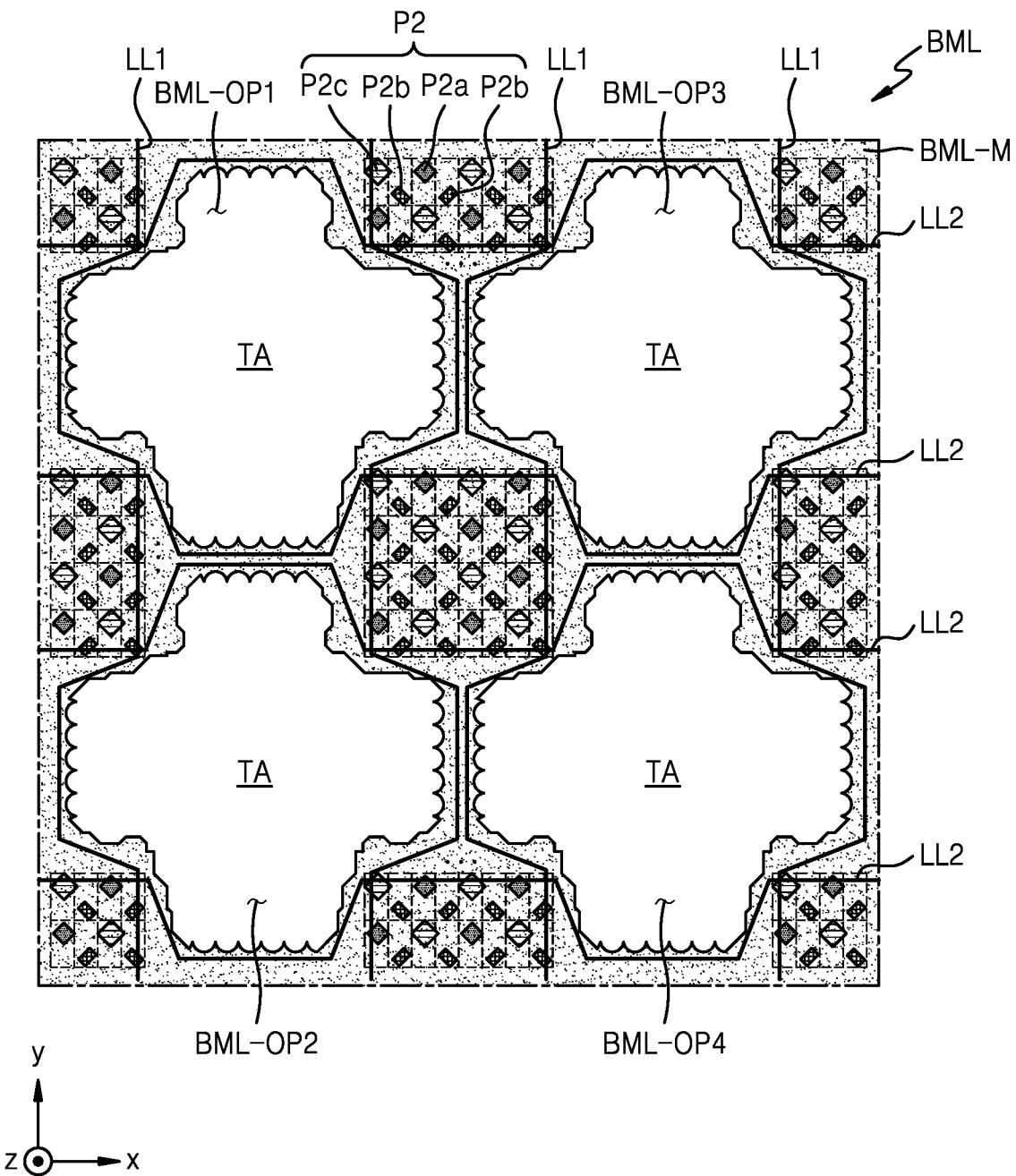
FIG. 12 is a plan view illustrating arrangement of a blocking layer, second pixels, and lines, according to an embodiment.

FIG. 12 is a plan view illustrating arrangement of a blocking layer BML, second pixels P2, and lines, according to an embodiment.

Referring to FIG. 12, the blocking layer BML may include openings and a metal portion BML-OP surrounding the openings. In an embodiment, FIG. 12 illustrates first to fourth openings (the first opening BML-OP1, the second opening BML-OP2, the third opening BML-OP3, and the fourth opening BML-OP4) arranged in or arranged along the x direction and the y direction.

The first opening BML-OP1 and the second opening BML-OP2 may be arranged adjacent to each other in the y direction, and the third opening BML-OP3 and the fourth opening BML-OP4 may be arranged adjacent to each other in the y direction. The first opening BML-OP1 and the third opening BML-OP3 may be arranged adjacent to each other in the x direction, and the second opening BML-OP2 and the fourth opening BML-OP4 may be arranged adjacent to each other in the x direction.

The first to fourth openings BML-OP1, BML-OP2, BML-OP3, and BML-OP4 may have the characteristics described above with reference to FIGS. 10, 11A, and 11B. For example, the first to fourth openings BML-OP1, BML-OP2, BML-OP3, and BML-OP4 may each include uneven edges including convex portions. The uneven edge of any one of the first to fourth openings BML-OP1, BML-OP2, BML-OP3, and BML-OP4 may face the uneven edge of another adjacent opening while being adjacent to the uneven edge of the other adjacent opening.

The uneven edge arranged at the lower portion of the first opening BML-OP1 may face the uneven edge arranged at the upper portion of the second opening BML-OP2 while being adjacent to the uneven edge arranged at the upper portion of the second opening BML-OP2. The uneven edge arranged at the right side of the first opening BML-OP1 may face the uneven edge arranged at the left side of the third opening BML-OP3 while being adjacent to the uneven edge arranged at the left side of the third opening BML-OP3.

In some embodiments, the openings of the blocking layer BML, for example, the first to fourth openings BML-OP1, BML-OP2, BML-OP3, and BML-OP4, may each define the transmission area TA. Therefore, the planar shape of the transmission area TA may be substantially the same as the shape of the opening of the blocking layer BML indicated by, for example, the shapes of the first to fourth openings BML-OP1, BML-OP2, BML-OP3, and BML-OP4.

The second pixels P2 may overlap the metal portion BML-M of the blocking layer BML. Pixels arranged in the same column from among the second pixels P2, for example, the first color pixel P2a, the second color pixel P2b, and the third color pixel P2c, may be connected (e.g., electrically connected) to lines extending in the y direction, and pixels arranged in the same row may be connected (e.g., electrically connected) to lines extending in the x direction.

First lines LL1 extending in the y direction and second lines LL2 extending in the x direction may overlap the metal portion BML-M of the blocking layer BML. For example, the second lines LL2 may overlap (e.g., overlap in the thickness direction) the metal portion BML-M located between the first opening BML-OP1 and the second opening BML-OP2. The first lines LL1 may overlap (e.g., overlap in the thickness direction) the metal portion BML-M located between the first opening BML-OP1 and the third opening BML-OP3 as illustrated in FIG. 12.

Lines (e.g., second lines LL2) may pass between the lower uneven edge of the first opening BML-OP1 and the upper uneven edge of the second opening BML-OP2, without the second pixels therebetween. In one or more embodiments, lines (e.g., second lines LL2) may pass between the lower uneven edge of the third opening BML-OP3 and the upper uneven edge of the fourth opening BML-OP4, without the second pixels therebetween. Lines (e.g., first lines LL1) may pass between the right uneven edge of the first opening BML-OP1 and the left uneven edge of the third opening BML-OP3, without the second pixels therebetween. In one or more embodiments, lines (e.g., first lines LL1) may pass between the right uneven edge of the second opening BML-OP2 and the left uneven edge of the fourth opening BML-OP4, without the second pixels therebetween.

The first lines LL1 and the second lines LL2 may include a scan line, a data line, a previous scan line, a next scan line, an initialization voltage line, and/or a driving voltage line, which have been described above with reference to FIG. 6A and/or FIG. 6B.

The opening BML-OP of the blocking layer BML described above with reference to FIGS. 10-12 has a cross shape as a whole and includes uneven edges, and the upper, lower, left, and right uneven edges of the opening BML-OP have the same or similar lengths, but the present disclosure is not limited thereto. In another embodiment, the opening BML-OP of the blocking layer BML may have various suitable shapes as illustrated in FIGS. 13-17.

FIGS. 13-19 are schematic plan views of a blocking layer BML according to an embodiment.

Figure 13:
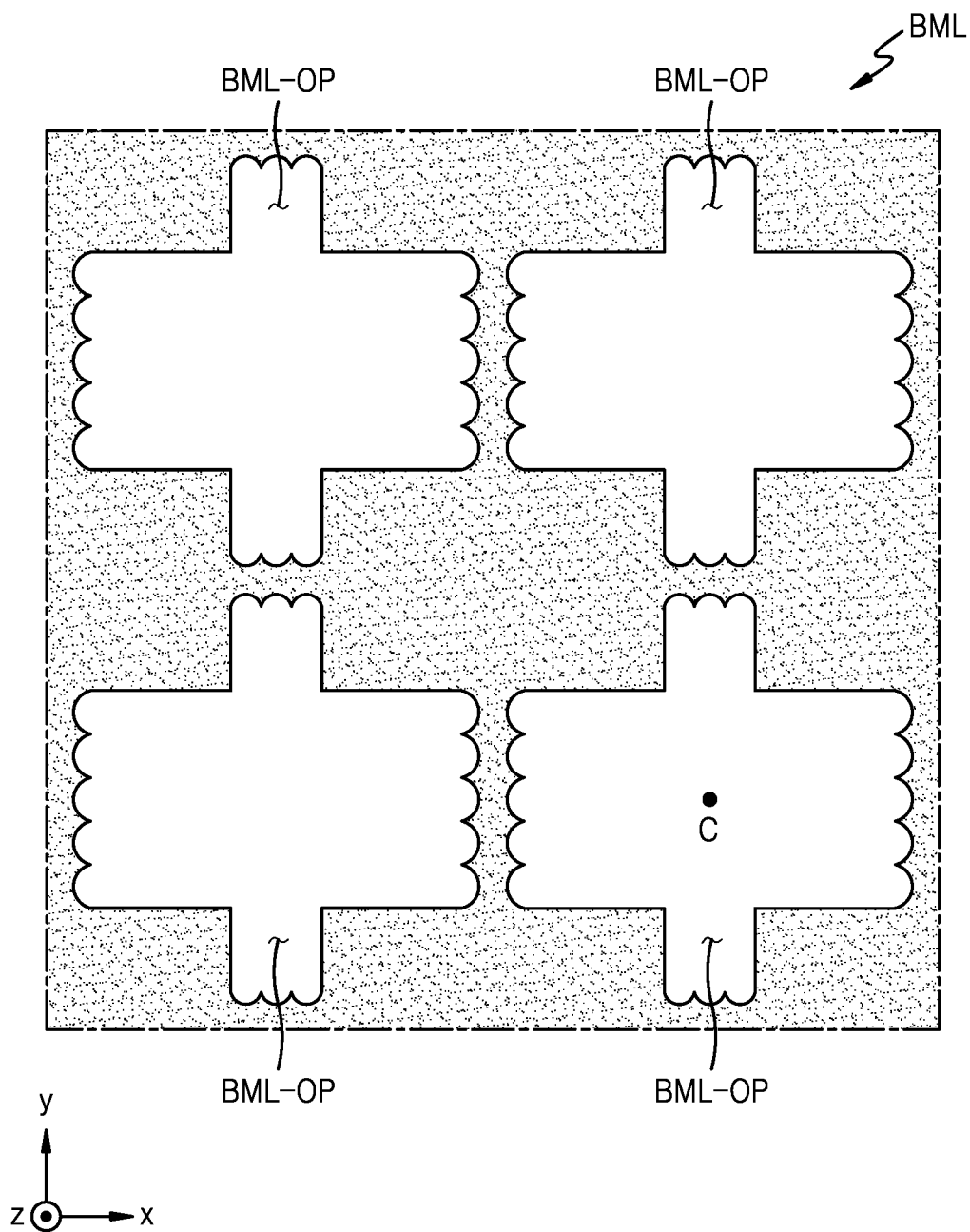
FIGS. 13-19 are schematic plan views of a blocking layer according to an embodiment.
Figure 14:
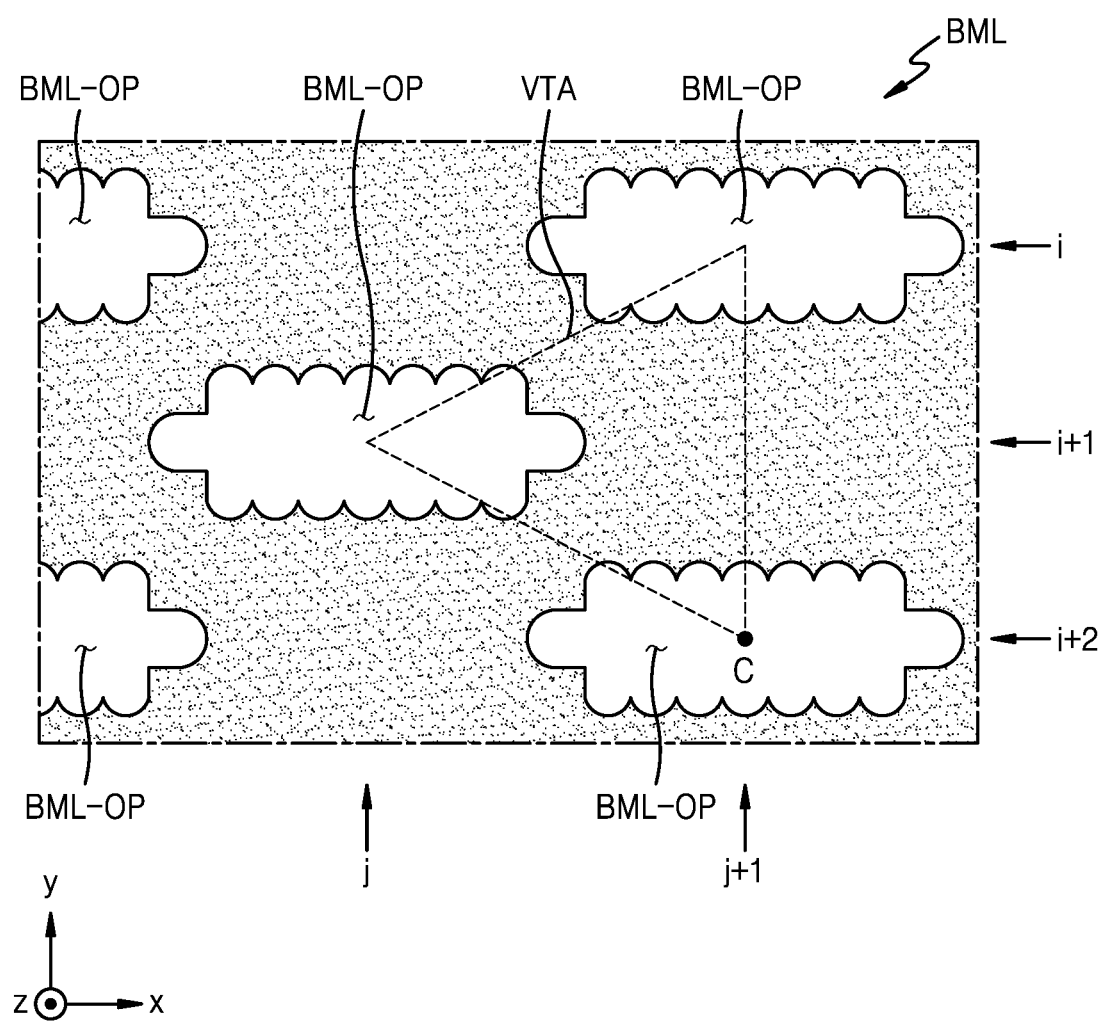

As illustrated in FIGS. 13 and 14, the blocking layer BML may include openings BML-OP, but the openings BML-OP may each have an uneven edge structure including convex portions. The openings BML-OP of the blocking layer BML illustrated in FIGS. 13 and 14 may have a substantially cross shape as illustrated in FIG. 12. The upper edge and the lower edge located at opposite sides with respect to the center C of the opening BML-OP may include an uneven structure, and the right edge and the left edge located at opposite sides with respect to the center C of the opening BML-OP may include an uneven structure. In an embodiment, the upper and lower edges may be shorter than the left and right edges, as illustrated in FIG. 13, or may be longer than the left and right edges, as illustrated in FIG. 14. The characteristics of the uneven structure of each edge, for example, the convex portions, are the same as described above with reference to FIGS. 10-11B.

Referring to FIGS. 12 and 13, the openings BML-OP of the blocking layer BML may be arranged in rows and columns in the x direction and the y direction. In some embodiments, as illustrated in FIG. 14, the openings BML-OP of the blocking layer BML may be arranged along a zigzag pattern in the x direction or the y direction. Any one opening BML-OP provided in a $j^{th}$ column may be located between two openings BML-OP provided in a $(j+1)^{th}$ column. No separate opening is provided between the opening BML-OP located in an $i^{th}$ row and a $(j+1)^{th}$ column and the opening BML-OP located in a $(i+2)^{th}$ row and a $(j+1)^{th}$ column. Three adjacent openings BML-OP arranged in a $j^{th}$ column and a $(j+1)^{th}$ column may be located at vertices of a virtual triangle VTA (except for a right triangle).

The openings BML-OP of the blocking layer BML illustrated in FIGS. 12, 13, and 14 may be horizontally symmetrical or vertically symmetrical with respect to an axis passing through the center C of the opening BML-OP, for example, an axis extending in the y direction or the x direction.

Figure 15:
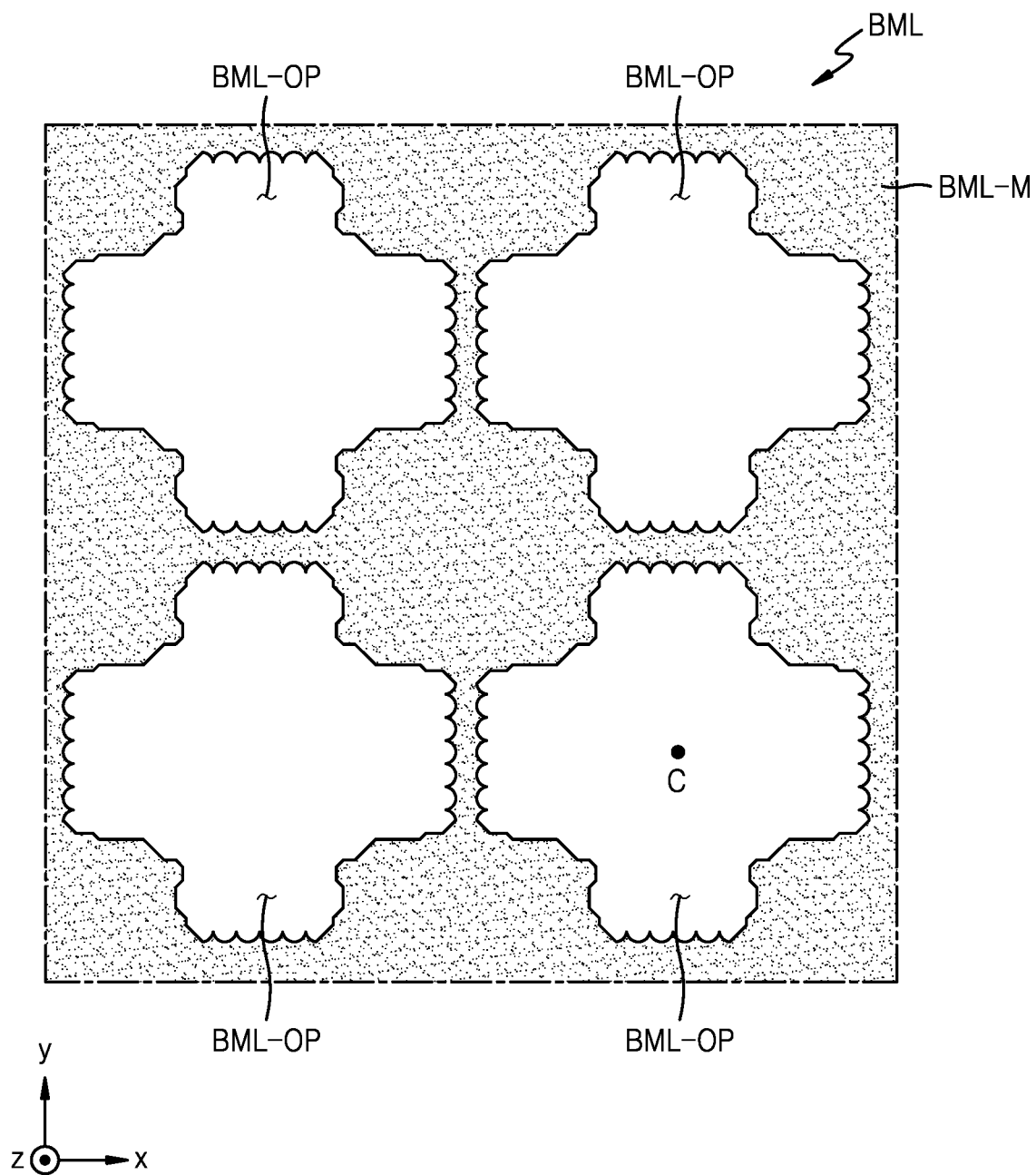
Figure 16:
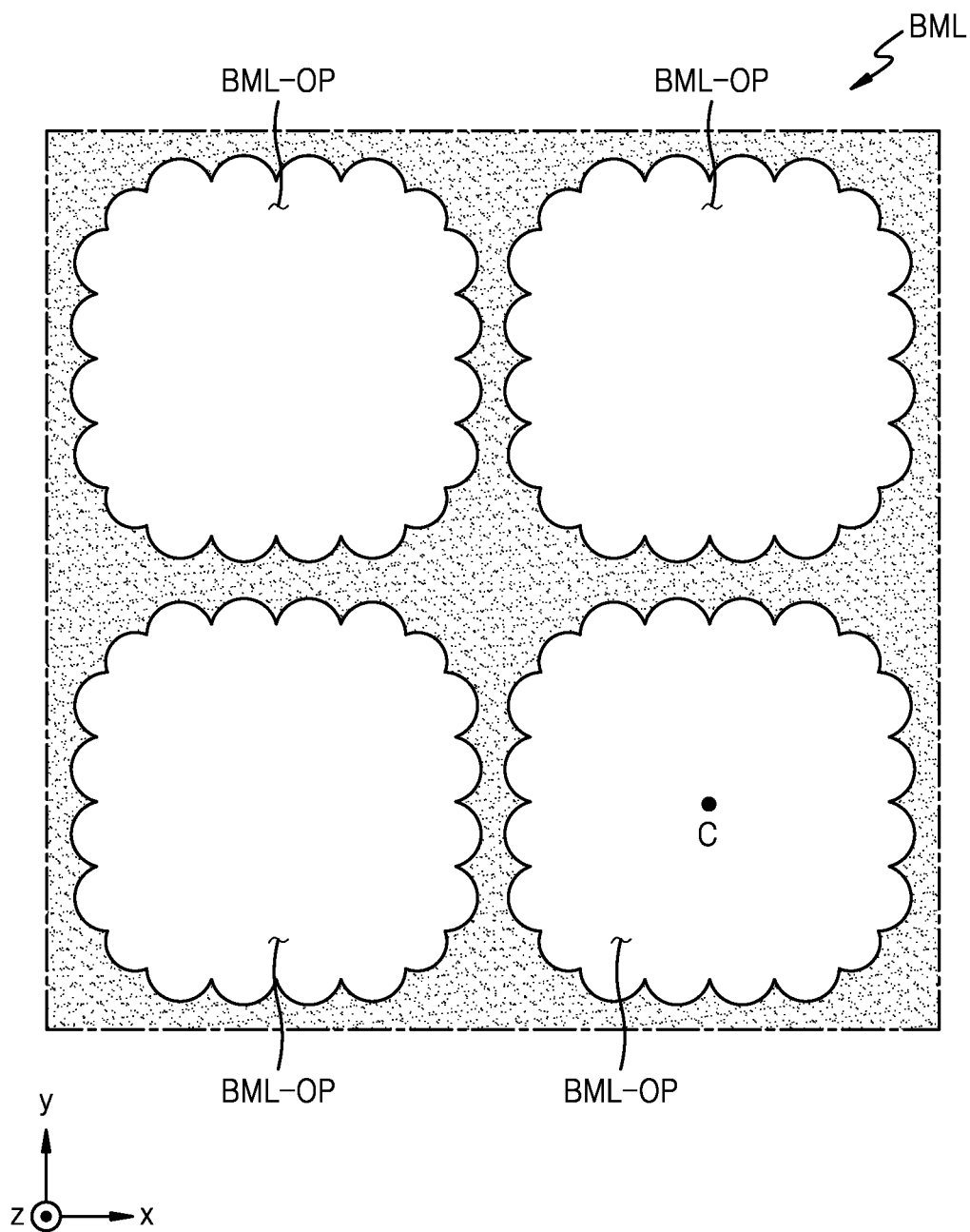
Figure 17:
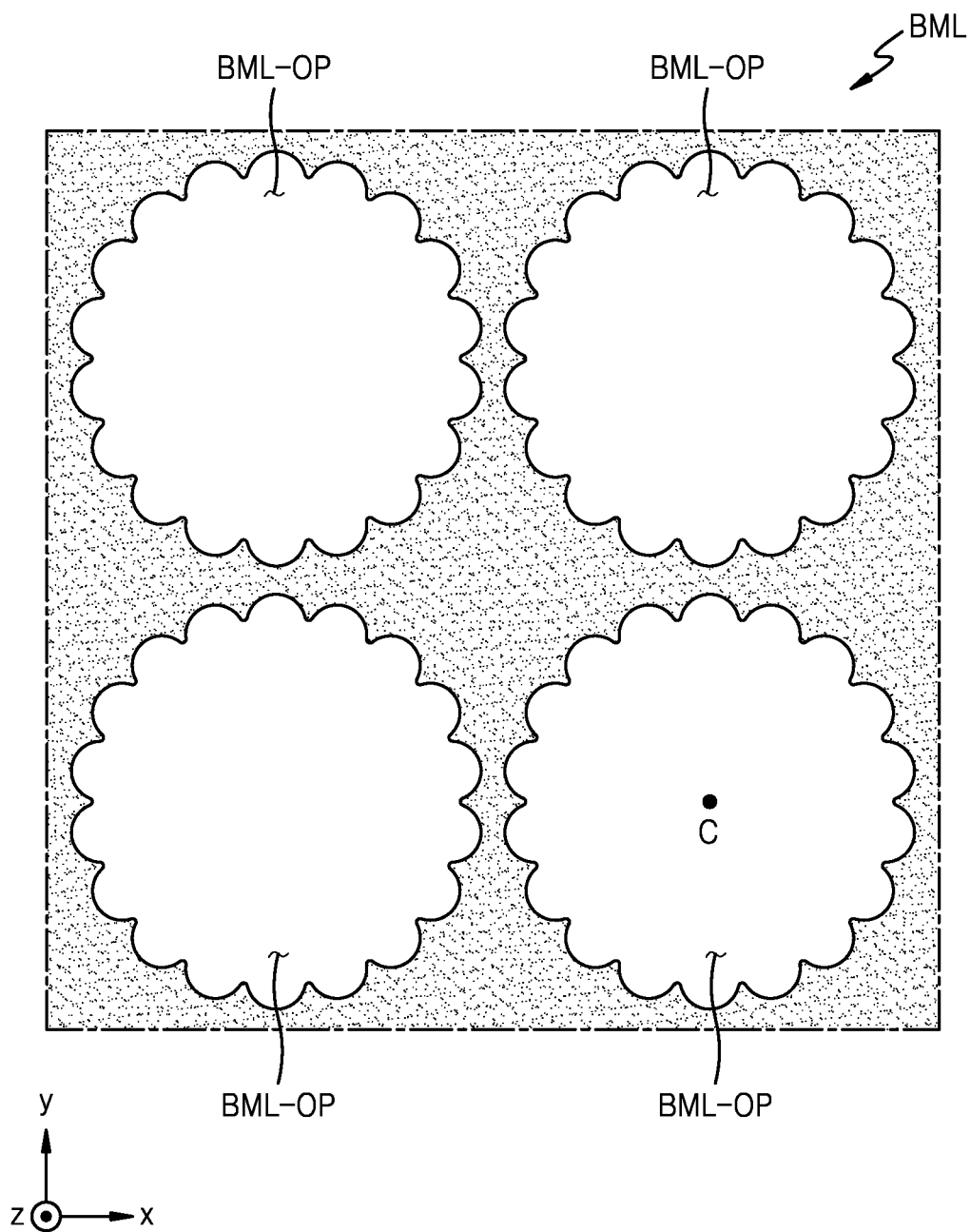
Figure 18:
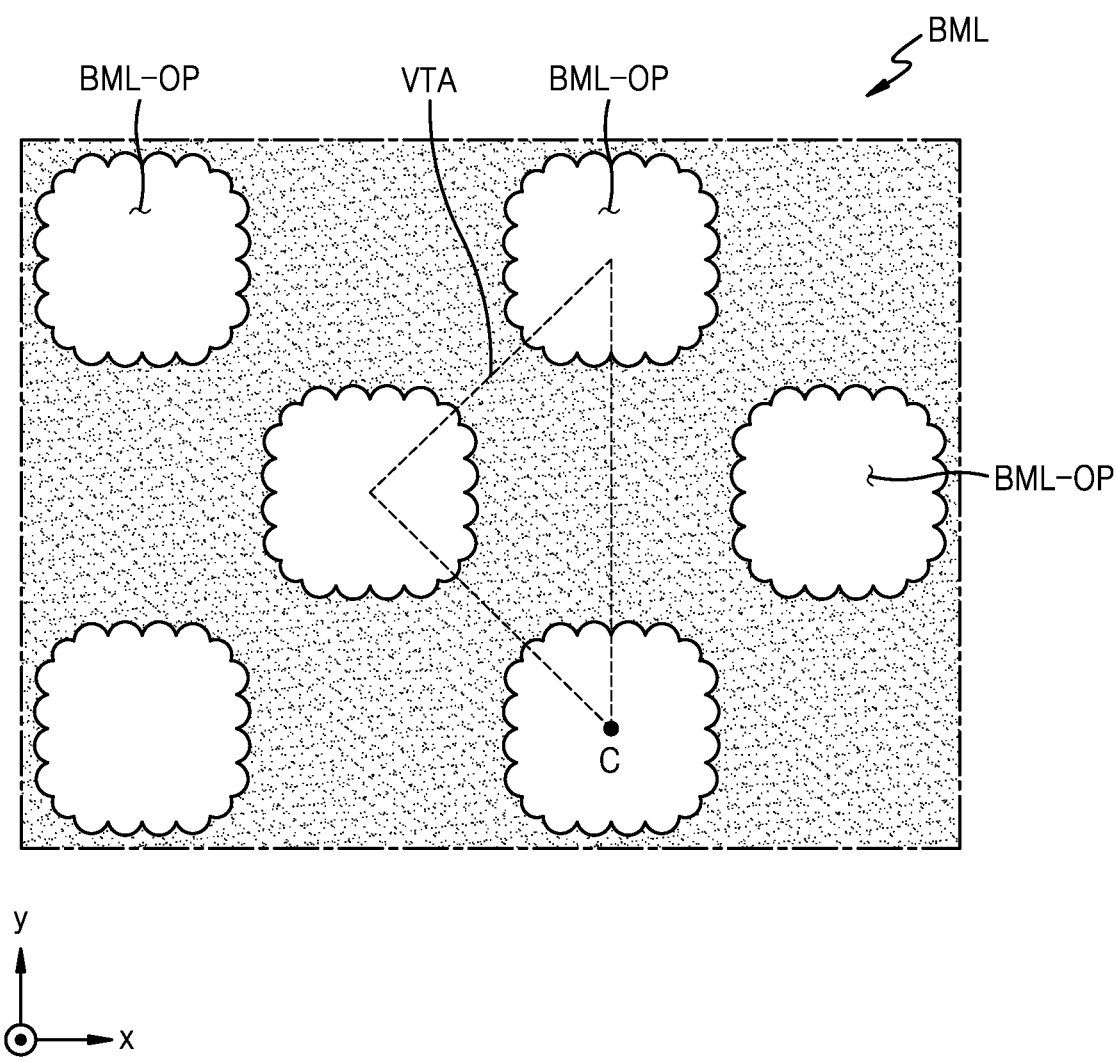
Figure 19:
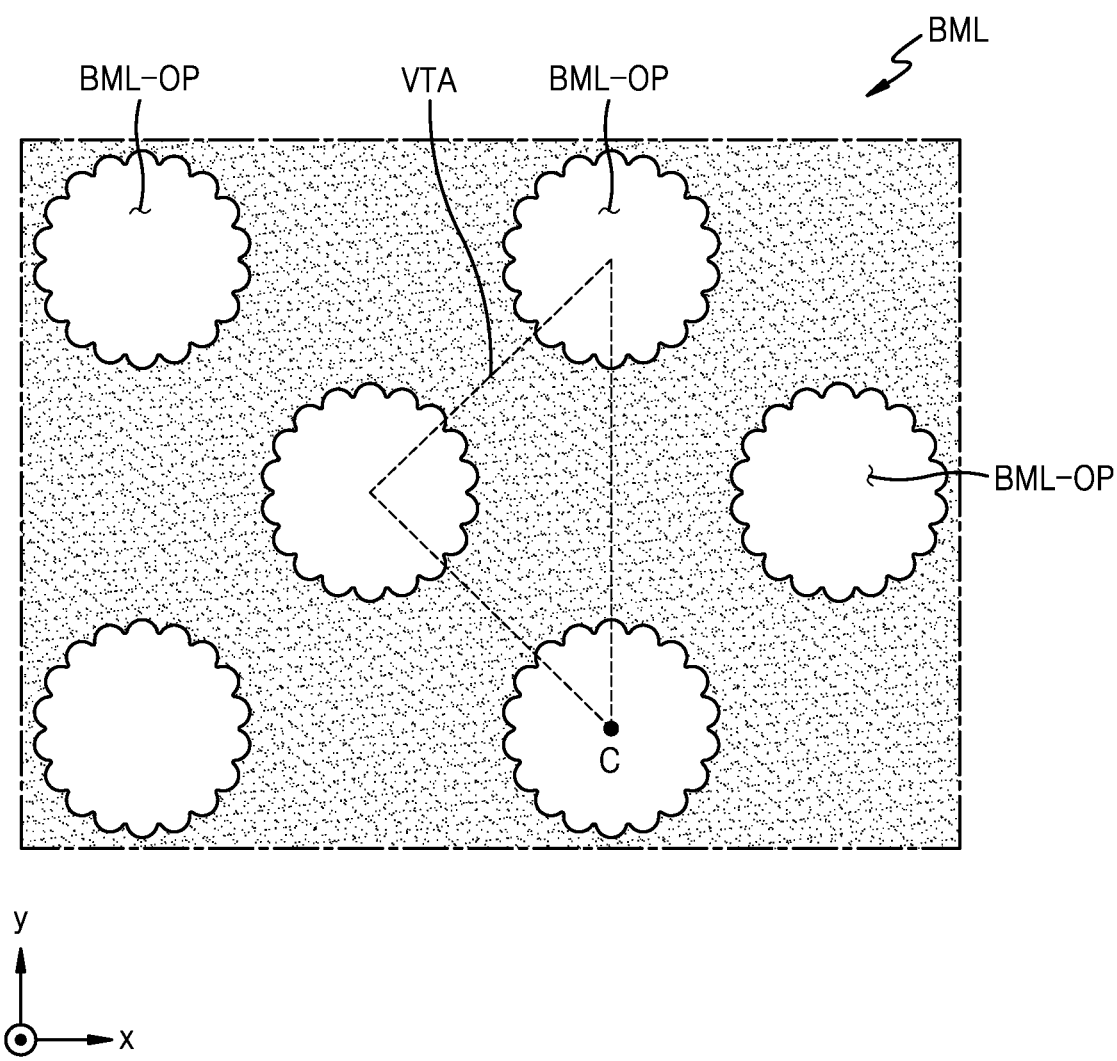

In another embodiment, as illustrated in FIGS. 15-19, the openings BML-OP of the blocking layer BML may be horizontally symmetrical and, at the same time, vertically symmetrical with respect to virtual axes passing through the center C and extending in they direction and the x direction. For example, as illustrated in FIG. 15, the opening BML-OP of the blocking layer BML may have a substantially cross shape having uneven edges including a plurality of convex portions. Alternatively, as illustrated in FIGS. 16 and 18, the opening BML-OP of the blocking layer BML may have a substantially quadrangular shape having uneven edges including a plurality of convex portions. Alternatively, as illustrated in FIGS. 17 and 19, the opening BML-OP of the blocking layer BML may have a substantially circular shape having uneven edges including a plurality of convex portions. The characteristics of the concave or convex portions provided at the edges of the opening BML-OP illustrated in FIGS. 15-19 are the same as described above.

The openings BML-OP of the blocking layer BML may be arranged in rows and columns in the x direction and the y direction, as illustrated in FIGS. 15-17, or may be arranged in a zigzag pattern, as illustrated in FIGS. 18 and 19. For example, three adjacent openings BML-OP illustrated in FIGS. 18 and 19 may be located at vertices of a virtual triangle VTA (except for a right triangle) as described above with reference to FIG. 14.

According to embodiments, the display panel capable of providing a high-quality image may be implemented, and diffraction of light received by the component may be prevented or reduced. However, this effect is merely an example, and the scope of the disclosure is not limited thereby.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display panel comprising:
   a substrate;
   two pixels on the substrate and spaced from each other with a transmission area therebetween; and
   a blocking layer between the substrate and the two pixels, the blocking layer defining an opening corresponding to the transmission area,
   wherein an edge of the opening comprises a plurality of convex portions.

2. The display panel of claim 1, wherein a width of each of the plurality of convex portions is less than or equal to 10% of a width of the opening.

3. The display panel of claim 2, wherein the width of each of the plurality of convex portions is 5% to 10% of the width of the opening.

4. The display panel of claim 1, wherein each of the plurality of convex portions is semi-circular, semi-elliptical, triangular, or quadrangular.

5. The display panel of claim 1, wherein each of the two pixels comprises a light-emitting diode, and
   wherein each of the light-emitting diodes is electrically connected to a pixel circuit comprising a transistor and a capacitor.

6. The display panel of claim 5, wherein the blocking layer is between the substrate and the pixel circuit.

7. The display panel of claim 1, wherein the opening of the blocking layer is symmetrical with respect to a virtual first axis passing through a center of the opening and extending in a first direction.

8. The display panel of claim 7, wherein the opening of the blocking layer is symmetrical with respect to a virtual second axis passing through the center of the opening and extending in a second direction intersecting the first direction.

9. The display panel of claim 7, wherein the opening of the blocking layer comprises:
   a first portion and a second portion arranged along the first direction and located at respective sides of the opening with the center of the opening therebetween; and
   a third portion and a fourth portion arranged along a second direction intersecting the first direction and located at respective sides of the opening with the center of the opening therebetween.

10. A display panel comprising:
    a substrate;
    two pixels on the substrate and spaced from each other with a transmission area therebetween; and
    a blocking layer between the substrate and the two pixels, the blocking layer defining an opening corresponding to the transmission area,
    wherein an edge of the opening comprises a plurality of convex portions,
    wherein the opening of the blocking layer is symmetrical with respect to a virtual first axis passing through a center of the opening and extending in a first direction,
    wherein the opening of the blocking layer comprises:
       a first portion and a second portion arranged along the first direction and located at respective sides of the opening with the center of the opening therebetween; and
       a third portion and a fourth portion arranged along a second direction intersecting the first direction and located at respective sides of the opening with the center of the opening therebetween, and
    wherein an edge of the first portion, an edge of the second portion, an edge of the third portion, and an edge of the fourth portion each comprise different ones of the plurality of convex portions.

\* \* \* \* \*